(12) United States Patent
Koezuka

(10) Patent No.: US 9,337,347 B2
(45) Date of Patent: May 10, 2016

(54) OXIDE SEMICONDUCTOR ELEMENT AND SEMICONDUCTOR DEVICE

(71) Applicant: Semiconductor Energy Laboratory Co., Ltd., Atsugi-shi, Kanagawa-ken (JP)

(72) Inventor: Junichi Koezuka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/575,122

(22) Filed: Dec. 18, 2014

(65) Prior Publication Data

US 2015/0102347 A1    Apr. 16, 2015

Related U.S. Application Data

(62) Division of application No. 13/353,597, filed on Jan. 19, 2012, now Pat. No. 8,916,867.

(30) Foreign Application Priority Data

Jan. 20, 2011    (JP) ................................. 2011-009745

(51) Int. Cl.
*H01L 29/10*    (2006.01)
*H01L 29/76*    (2006.01)
(Continued)

(52) U.S. Cl.
CPC ...... *H01L 29/7869* (2013.01); *H01L 29/66742* (2013.01); *H01L 29/66969* (2013.01); *H01L 29/78693* (2013.01); *H01L 29/78696* (2013.01)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Sonya D McCall Shepard
(74) *Attorney, Agent, or Firm* — Robinson Intellectual Property Law Office; Eric J. Robinson

(57) ABSTRACT

A semiconductor element having high mobility, which includes an oxide semiconductor layer having crystallinity, is provided. The oxide semiconductor layer includes a stacked-layer structure of a first oxide semiconductor film and a second oxide semiconductor film having a wider band gap than the first oxide semiconductor film, which is in contact with the first oxide semiconductor film. Thus, a channel region is formed in part of the first oxide semiconductor film (that is, in an oxide semiconductor film having a smaller band gap) which is in the vicinity of an interface with the second oxide semiconductor film. Further, dangling bonds in the first oxide semiconductor film and the second oxide semiconductor film are bonded to each other at the interface therebetween. Accordingly, a decrease in mobility resulting from an electron trap or the like due to dangling bonds can be reduced in the channel region.

16 Claims, 12 Drawing Sheets

(51) Int. Cl.
  *H01L 31/036* (2006.01)
  *H01L 31/112* (2006.01)
  *H01L 29/786* (2006.01)
  *H01L 29/66* (2006.01)

(56) References Cited

U.S. PATENT DOCUMENTS

| | | | |
|---|---|---|---|
| 6,127,702 A | 10/2000 | Yamazaki et al. |
| 6,218,714 B1 | 4/2001 | Yamazaki |
| 6,232,642 B1 | 5/2001 | Yamazaki |
| 6,294,274 B1 | 9/2001 | Kawazoe et al. |
| 6,486,014 B1 | 11/2002 | Miyanaga et al. |
| 6,563,174 B2 | 5/2003 | Kawasaki et al. |
| 6,653,687 B1 | 11/2003 | Yamazaki |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,318,948 B1 | 1/2008 | Drehman |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,143,115 B2 | 3/2012 | Omura et al. |
| 8,143,678 B2 | 3/2012 | Kim et al. |
| 8,148,721 B2 | 4/2012 | Hayashi et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,558,323 B2 | 10/2013 | Kim et al. |
| 8,669,551 B2 | 3/2014 | Kim et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0295037 A1 | 11/2010 | Hironaka |
| 2010/0320458 A1 | 12/2010 | Umeda et al. |
| 2010/0320459 A1 | 12/2010 | Umeda et al. |
| 2011/0127521 A1 | 6/2011 | Yamazaki |
| 2011/0193083 A1 | 8/2011 | Kim et al. |
| 2011/0309411 A1 | 12/2011 | Takemura |
| 2012/0104385 A1 | 5/2012 | Godo et al. |
| 2012/0119205 A1 | 5/2012 | Taniguchi et al. |
| 2012/0132903 A1 | 5/2012 | Yamazaki et al. |
| 2012/0132904 A1 | 5/2012 | Yamazaki |
| 2012/0132905 A1 | 5/2012 | Yamazaki |
| 2012/0168750 A1 | 7/2012 | Hayashi et al. |
| 2015/0084048 A1 | 3/2015 | Hayashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-034461 A | 2/1991 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 2007-096055 A | 4/2007 |
| JP | 2007-096126 A | 4/2007 |
| JP | 2007-123861 A | 5/2007 |
| JP | 2008-166716 A | 7/2008 |
| JP | 2008-199005 A | 8/2008 |
| JP | 2009-135380 A | 6/2009 |
| JP | 2009-218562 A | 9/2009 |
| JP | 2009-224356 A | 10/2009 |
| JP | 2009-231613 A | 10/2009 |
| JP | 2010-016347 A | 1/2010 |
| JP | 2010-028021 A | 2/2010 |
| JP | 2010-040815 A | 2/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2010-272663 A | 12/2010 |
| WO | WO-2004/114391 | 12/2004 |
| WO | WO-2008/069056 | 6/2008 |
| WO | WO-2008/069255 | 6/2008 |
| WO | WO-2008/133345 | 11/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T at al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J at al., "Improvements in the Device Characteristics of Amorphous Indium Gallium Zinc Oxide Thin-Film Transistory by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M at al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Dislpay Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in CHIRAL Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

OXIDE SEMICONDUCTOR ELEMENT AND SEMICONDUCTOR DEVICE

BACKGROUND OF THE INVENTION

1. Field of the Invention

The present invention relates to an oxide semiconductor element and a semiconductor device.

2. Description of the Related Art

Semiconductor elements (hereinafter referred to as silicon semiconductor elements) such as transistors using silicon for semiconductor layers are used for a variety of semiconductor devices and have become essential technologies for manufacturing semiconductor devices. In order to manufacture large semiconductor devices, a method using a material which is suitable for increasing in size, for example, glass or the like, for a substrate, and thin-film silicon for a semiconductor layer, which can be formed over a large area has been widely employed.

In such semiconductor elements using thin-film silicon, semiconductor layers need to be formed at temperatures less than or equal to the upper temperature limits of substrates. Thus, amorphous silicon and polysilicon which can be formed at relatively low temperatures are widely used.

Amorphous silicon has advantages of being able to be deposited over a large area and allowing semiconductor elements having uniform element characteristics to be manufactured by a simple process at relatively low cost; thus, amorphous silicon has been widely used for semiconductor devices with a large area, such as solar batteries. Meanwhile, amorphous silicon has a disadvantage of low electron mobility due to the fact that an amorphous structure causes a scattering of electrons at grain boundaries.

In order to make up for the disadvantage, polysilicon, whose mobility is improved by irradiating amorphous silicon with laser or the like to be locally dissolved and recrystallized, or by crystallization using a catalytic element, is widely used in semiconductor devices such as liquid crystal displays in which both large area and high carrier mobility need to be achieved.

In addition, in recent years, oxide semiconductors that are metal oxides having semiconductor characteristics have attracted attention as novel semiconductor layer materials having high mobility, which is an advantage of polysilicon, and a uniform element characteristic, which is an advantage of amorphous silicon.

As semiconductor elements (hereinafter referred to as oxide semiconductor elements) such as transistors using oxide semiconductors as semiconductor layers, for example, as in Patent Documents 1 and 2, a thin film transistor manufactured using tin oxide, indium oxide, zinc oxide, or the like has been proposed.

As described above, oxide semiconductor elements have a variety of advantages. However, since a phenomenon in which the threshold voltage is changed due to light irradiation occurs, there is a problem in reliability. In recent years, it has been discussed that oxygen deficiency or hydrogen in oxide semiconductor layers affects a change in threshold voltage by light irradiation.

REFERENCE

Patent Documents

[Patent Document 1] Japanese Published Patent Application No. 2007-123861
[Patent Document 2] Japanese Published Patent Application No. 2007-096055

SUMMARY OF THE INVENTION

As one method for solving the problem, there is a method in which an oxide semiconductor layer is heated for crystallization. In a crystallized oxide semiconductor layer, a bond between a metal atom and an oxygen atom is more orderly than in an amorphous oxide semiconductor layer, and the coordination numbers of oxygen atoms around a metal atom are substantially the same. Thus, microscopic oxygen defects can be reduced. Further, heat treatment for crystallization makes it possible to desorb hydrogen from the inside of oxide semiconductors and reduce the hydrogen concentration in the oxide semiconductor layer. Therefore, a change in threshold voltage by light irradiation can be reduced.

However, there are a number of dangling bonds on the surfaces of crystallized oxide semiconductor layers. When channel regions are formed in regions including the surfaces of the crystallized oxide semiconductor layers containing a number of dangling bonds, a decrease in mobility resulting from a carrier trap or the like by dangling bonds occurs.

On the other hand, it is clear that higher mobility of an oxide semiconductor element is needed in the future.

The present invention is made in view of the foregoing technical background. Thus, it is an object of one embodiment of the present invention to provide an oxide semiconductor element having high mobility, whose semiconductor layer includes an oxide semiconductor having crystallinity and threshold voltage is not changed by light irradiation.

It is another object of one embodiment of the present invention to provide a semiconductor device which is manufactured using the oxide semiconductor element for at least one part and can operate at high speed.

In order to achieve the objects, dangling bonds in a region where a channel region is formed need to be reduced. Accordingly, in the present invention, oxide semiconductor films having crystallinity are stacked, whereby dangling bonds in an oxide semiconductor film are bonded to dangling bonds in another oxide semiconductor film to reduce dangling bonds at an interface between the films. Further, the oxide semiconductor films having different values of a band gap are stacked so that a channel region is formed in a region including the interface in which dangling bonds are reduced. Specifically, used is a layer having a stacked-layer structure of a first oxide semiconductor film and a second oxide semiconductor film which is in contact with the first oxide semiconductor film and has a wider band gap than the first oxide semiconductor film, as an oxide semiconductor layer.

As described above, the first oxide semiconductor film and the second oxide semiconductor film having a wider band gap than the first oxide semiconductor film are formed to be in contact with each other, whereby a channel region is formed in part of the first oxide semiconductor film (i.e., an oxide semiconductor film having a smaller band gap) which is in the vicinity of an interface with the second oxide semiconductor film.

Accordingly, a decrease in mobility resulting from an electron trap or the like due to dangling bonds can be reduced in the channel region formed in part of the first oxide semiconductor film which is in the vicinity of an interface with the second oxide semiconductor film. Thus, an oxide semiconductor element having high mobility, in which the threshold voltage is not changed by light irradiation can be provided.

Further, with the use of the oxide semiconductor element having the above characteristics for at least one part, a semiconductor device which can operate at high speed can be provided.

One embodiment of the present invention is an oxide semiconductor element including an oxide semiconductor layer formed over an insulating surface, a gate insulating layer formed over the oxide semiconductor layer, a gate electrode formed in a region overlapping with the oxide semiconductor layer with the gate insulating layer provided therebetween, and a pair of source and drain electrodes each of which is electrically connected to the oxide semiconductor layer. The oxide semiconductor layer has a stacked-layer structure of a first oxide semiconductor film and a second oxide semiconductor film, and the first oxide semiconductor film and the second oxide semiconductor film have crystallinity. The second oxide semiconductor film is sandwiched between the gate insulating layer and the first oxide semiconductor film, in a gap between the source and drain electrodes. The gap between the source and drain electrodes overlaps with the gate electrode. A value of a band gap of the first oxide semiconductor film is smaller than that of the second oxide semiconductor film.

According to the above embodiment of the present invention, a channel region is formed in a region with less dangling bonds, which is in the first oxide semiconductor film and is in the vicinity of an interface with the second oxide semiconductor film. Thus, an oxide semiconductor element having high mobility, in which the threshold voltage is not changed by light irradiation can be provided.

One embodiment of the present invention is an oxide semiconductor element including a gate electrode formed over an insulating surface, a gate insulating layer formed over the gate electrode, an oxide semiconductor layer formed over the gate insulating layer, and a pair of source and drain electrodes each of which is electrically connected to the oxide semiconductor layer. The oxide semiconductor layer has a stacked-layer structure of a first oxide semiconductor film and a second oxide semiconductor film, and the first oxide semiconductor film and the second oxide semiconductor film have crystallinity. The second oxide semiconductor film is sandwiched between the gate insulating layer and the first oxide semiconductor film in a gap between the source and drain electrodes. The gap between the source and drain electrodes overlaps with the gate electrode. A value of a band gap of the first oxide semiconductor film is smaller than that of the second oxide semiconductor film.

According to the above embodiment of the present invention, a channel region is formed in a region with less dangling bonds, which is in the first oxide semiconductor film and is in the vicinity of an interface with the second oxide semiconductor film. Thus, an oxide semiconductor element having high mobility, in which the threshold voltage is not changed by light irradiation can be provided.

One embodiment of the present invention is an oxide semiconductor element including an oxide semiconductor layer one surface of which is in contact with an insulating surface, a pair of low-resistance regions each of which is in contact with a side surface of the oxide semiconductor layer and one surface of each of which is in contact with the insulating surface, a gate insulating layer which is in contact with another surface of the oxide semiconductor layer and another surface of each of the pair of low-resistance regions, a gate electrode formed in a region overlapping with the oxide semiconductor layer with the gate insulating layer provided therebetween, and a pair of source and drain electrodes each of which is electrically connected to one of the pair of low-resistance regions. The another surface of the oxide semiconductor layer and the another surface of each of the pair of low-resistance regions are coplanar. The oxide semiconductor layer has a stacked-layer structure of a first oxide semiconductor film and a second oxide semiconductor film, and the first oxide semiconductor film and the second oxide semiconductor film have crystallinity. The second oxide semiconductor film is sandwiched between the gate insulating layer and the first oxide semiconductor film. A value of a band gap of the first oxide semiconductor film is smaller than that of the second oxide semiconductor film. The resistivity of each of the pair of the low-resistance regions is higher than or equal to $1\times10^{-4}$ Ω·cm and lower than or equal to 3 Ω·cm.

According to the above embodiment of the present invention, a channel region is formed in a region with less dangling bonds, which is in the first oxide semiconductor film and is in the vicinity of an interface with the second oxide semiconductor film. Thus, an oxide semiconductor element having high mobility, in which the threshold voltage is not changed by light irradiation can be provided.

Further, the source electrode and the drain electrode are in contact with the low-resistance regions and current in regions between the source electrode and the channel region, and the drain electrode and the channel region flows in the low-resistance region having lower resistivity than the oxide semiconductor layer; therefore, a reduction in on-state current can be suppressed. Thus, an oxide semiconductor element having a high on-off ratio can be provided.

Furthermore, one embodiment of the present invention is an oxide semiconductor element in which a value of a band gap of a second oxide semiconductor film is larger by 0.2 eV or more than that of a first oxide semiconductor film.

According to the above embodiment of the present invention, leakage current which flows in a region other than a channel region can be suppressed, whereby power consumption of an oxide semiconductor element can be reduced.

Moreover, one embodiment of the present invention is a semiconductor device in which the oxide semiconductor element is used for at least one part.

According to the above embodiment of the present invention, a semiconductor device which can operate at high speed can be provided.

When "B is formed on A" or "B is formed over A" is explicitly described in this specification or the like, it does not necessarily mean that B is formed in direct contact with A. The expression includes the case where A and B are not in direct contact with each other, that is, the case where another object is provided between A and B. Here, each of A and B corresponds to an object (e.g., a device, an element, a circuit, a wiring, an electrode, a terminal, a film, or a layer).

Thus, for example, when it is explicitly described that a layer B is formed on or over a layer A, it includes both the case where the layer B is formed in direct contact with the layer A and the case where another layer (e.g., a layer C or a layer D) is formed in direct contact with the layer A and the layer B is formed in direct contact with the another layer. Note that the another layer (e.g., the layer C or the layer D) may be a single layer or a plurality of layers.

Further, in this specification or the like, the ordinal numbers such as "first" and "second" are given for convenience to distinguish elements, and not given to limit the number, the arrangement, and the order of the steps.

According to one embodiment of the present invention, an oxide semiconductor element having high mobility, whose semiconductor layer includes an oxide semiconductor having crystallinity and threshold voltage is not changed by light irradiation can be provided.

Further, according to one embodiment of the present invention, a semiconductor device which can operate at high speed can be provided.

DETAILED DESCRIPTION OF THE INVENTION

Figure 1A:
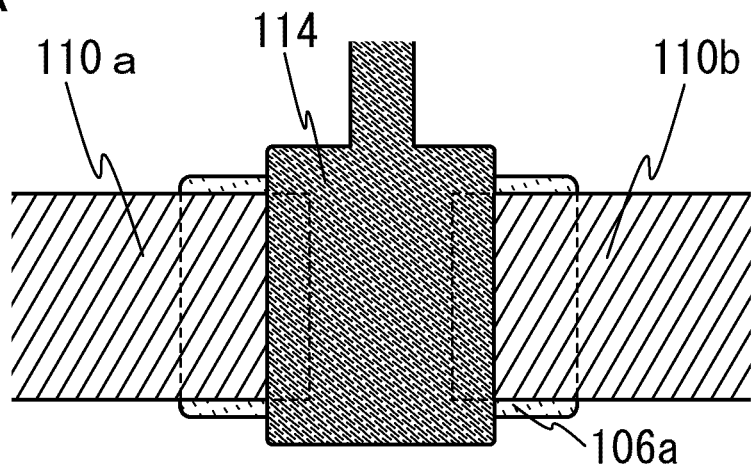
FIGS. 1A and 1B are views illustrating a structure of an oxide semiconductor element described in Embodiment 1.

Embodiments will be described in detail with reference to the drawings. However, the present invention is not limited to the following description and a variety of changes for the modes and details thereof will be apparent to those skilled in the art unless such changes depart from the spirit and the scope of the invention. The present invention should not be construed as being limited to the following description. In the structures of the invention to be given below, the same portions or portions having similar functions are denoted by the same reference numerals in different drawings, and explanation thereof will not be repeated.

Embodiment 1

In this embodiment, a method for manufacturing an oxide semiconductor element according to one embodiment of the disclosed invention will be described with reference to FIGS. 1A and 1B, FIGS. 2A to 2E, and FIGS. 3A to 3D.

<Method for Manufacturing Oxide Semiconductor Element in Embodiment 1>

Figure 1B:
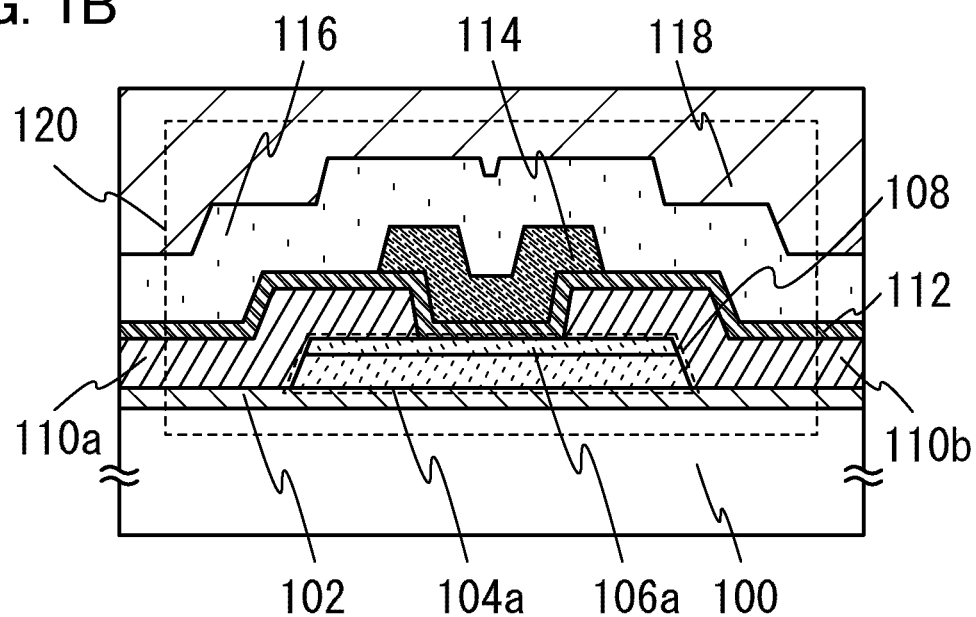

FIGS. 1A and 1B are views illustrating a top-gate transistor 120 which is an example of a structure of a semiconductor device manufactured by a method in this embodiment. FIGS. 1A and 1B are a top view and a cross-sectional view of the transistor 120, respectively. Note that some components (a substrate 100, for example) are omitted in FIG. 1A to avoid complication. Although a method for manufacturing an n-channel transistor whose carriers are electrons will be described as the transistor 120 in this embodiment, the transistor 120 is not limited to the n-channel transistor.

A method for manufacturing the transistor 120 will be described below with reference to FIGS. 2A to 2E and FIGS. 3A to 3D.

Figure 2A:
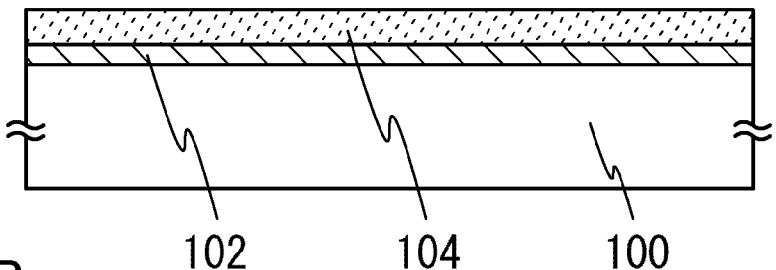
FIGS. 2A to 2E are views illustrating a method for manufacturing an oxide semiconductor element described in Embodiment 1.

First, an insulating layer 102 is formed over the substrate 100 and then a first oxide semiconductor film 104 is formed (see FIG. 2A).

Any substrate can be used as the substrate 100 as long as the substrate has an insulating surface. For example, a non-alkali glass substrate such as an aluminosilicate glass substrate, an aluminoborosilicate glass substrate, or a barium borosilicate glass substrate can be used. Such a glass substrate is suitable for increasing in size, so that glass substrates of G10 size (2850 mm×3050 mm), G11 size (3000 mm×3320 mm), and the like are manufactured; thus, the semiconductor device according to one embodiment of the present invention can be mass-produced at low cost. Alternatively, as the substrate 100, an insulating substrate formed using an insulator, such as a quartz substrate or a sapphire substrate; a semiconductor substrate which is formed using a semiconductor material such as silicon, whose surface is covered with an insulating material; or a conductive substrate which is formed using a conductor such as metal or stainless steel, whose surface is covered with an insulating material can be used.

As the insulating layer 102 which prevents diffusion of impurities from the substrate 100, a silicon oxide film, a silicon nitride film, a silicon oxynitride film, a silicon nitride oxide film, an aluminum oxide film, a hafnium oxide film, a tantalum oxide film, or the like may be formed by a CVD method, a sputtering method, or the like. Note that the insulating layer 102 may have a single-layer structure or a stacked-layer structure. In the case of a stacked-layer structure, the above films may be combined to form the insulating layer 102.

The insulating layer 102 is preferably formed using an oxide insulating film from which some contained oxygen is desorbed by heating. An oxide insulating film which contains oxygen at an amount exceeding the amount of oxygen in its stoichiometric composition is preferably used as the oxide insulating film from which some contained oxygen is desorbed by heating. Oxygen can be diffused from the oxide insulating film into the oxide semiconductor film by heat treatment in the state where the oxide insulating film is in contact with the oxide semiconductor film. When oxygen desorbed from the insulating layer 102 is diffused into the oxide semiconductor film, an interface state between the insulating layer 102 and the first oxide semiconductor film 104 can be reduced. As a result, electric charge or the like which may be produced due to an operation of a transistor or the like can be prevented from being trapped at the interface between the insulating layer 102 and the first oxide semiconductor film 104. Consequently, field effect mobility of the transistor can be improved. In addition, variation and a change in the threshold voltage can be reduced. Examples of the oxide insulating film from which some contained oxygen is desorbed by heating include films of silicon oxide, silicon oxynitride, silicon nitride oxide, gallium oxide, hafnium oxide, yttrium oxide, and the like.

Here, the "oxide insulating film from which some contained oxygen is desorbed by heating" means a film in which the released amount of oxygen which is converted to oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis.

There is no particular limitation on the thickness of the insulating layer 102; the insulating layer 102 preferably has a thickness of greater than or equal to 10 nm and less than or equal to 500 nm, for example. When the insulating layer 102 has a thickness of less than 10 nm, the insulating layer 102 might not be formed in some regions because of thickness distribution within a substrate surface due to a deposition apparatus. Moreover, the insulating layer 102 having a thickness of greater than 500 nm is not preferable in terms of deposition time and a manufacturing cost. Note that a structure without the insulating layer 102 can also be employed.

The first oxide semiconductor film 104 is in a single crystal state, a polycrystalline (also referred to as polycrystal) state, an amorphous state, or the like.

The first oxide semiconductor film 104 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal portions and amorphous portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement when seen from a direction perpendicular to the a-b plane is formed, and metal atoms are arranged in a layered manner or metal atoms and oxygen atoms are arranged in a layered manner when seen from a direction perpendicular to the c-axis. Note that, among crystal portions, directions of the a-axis and directions of the b-axis may be different from those of another crystal portion. In this specification, a simple term "perpendicular" includes a range from 85° to 95°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that in the case where the CAAC-OS film is processed (in the case of forming an island-shaped semiconductor layer, for example), the direction of c-axis of the crystal portion is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With use of the CAAC-OS film in a transistor, change in electric characteristics of the transistor due to irradiation with visible light or ultraviolet light can be reduced.

An oxide semiconductor to be used for the first oxide semiconductor film 104 preferably contains at least indium (In) or zinc (Zn). In particular, both In and Zn are preferably contained. As a stabilizer for reducing variation in electric characteristics of a transistor using the oxide semiconductor, it is preferable to further contain gallium (Ga). Tin (Sn) is preferably contained as the stabilizer. It is preferable that one or more selected from hafnium (Hf), zirconium (Zr), titanium (Ti), scandium (Sc), and yttrium (Y) as the stabilizer. As another stabilizer, one or more lanthanoids which include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used for the oxide semiconductor. Note that M represents one or more metal elements selected from Ga, Fe, Mn, and Co, or the above-described element as a stabilizer. Further alternatively, a material represented by $In_2SnO_5(ZnO)_n$ (n>0 is satisfied, and n is an integer) may be used for the oxide semiconductor.

As an example, an In—Ga—Zn-based oxide target having a composition ratio where In:Ga:Zn=1:1:1 (=$1/3$:$1/3$:$1/3$), In:Ga:Zn=2:2:1 ($2/5$:$2/5$:$1/5$), or In:Ga:Zn=3:1:2 (=$1/2$:$1/6$:$1/3$) in an atomic ratio, or an oxide target with an atomic ratio close to the above ratios can be used. Alternatively, an In—Sn—Zn-based oxide target having a composition ratio where In:Sn:Zn=1:1:1 (=$1/3$:$1/3$:$1/3$), In:Sn:Zn=2:1:3 ($1/3$:$1/6$:$1/2$), or In:Sn:Zn=2:1:5 (=$1/4$:$1/8$:$5/8$) in an atomic ratio, or an oxide target with an atomic ratio close to the above ratios may be used.

However, the composition of the oxide semiconductor containing at least indium (In) or zinc (Zn) is not limited to those described above, and a material having an appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate. For example, high mobility can be obtained relatively easily in the case of using an In—Sn—Zn-based oxide. However, mobility can be increased by reducing the defect density in a bulk also in the case of using an In—Ga—Zn-based oxide.

The relative density of an oxide semiconductor in a target is greater than or equal to 80%, preferably greater than or equal to 95%, further preferably greater than or equal to 99.9%. With the use of an oxide semiconductor target with high relative density, a dense film is formed.

A sputtering gas used for deposition of the first oxide semiconductor film 104 contains at least nitrogen or phosphorus. The sputtering gas may contain a rare gas (typically argon), oxygen, or a mixed gas of a rare gas and oxygen, in addition to nitrogen and phosphorus. In addition, it is preferable to use a high-purity gas in which impurities such as hydrogen, water, a hydroxyl group, or hydride are reduced to such a degree that the concentration thereof can be expressed by the unit ppm (preferably, ppb). In this embodiment, deposition is performed while nitrogen used as a sputtering gas is introduced into a sputtering apparatus at a flow rate of 40 sccm.

With the use of a gas containing at least nitrogen or phosphorus as a sputtering gas, a value of a band gap of the first oxide semiconductor film 104 can be reduced by first heat treatment performed in a later step, as compared with the case of using a sputtering gas containing neither nitrogen nor phosphorus. For example, as shown in Table 1, according to an experiment, in the case of deposition using a metal oxide target where $In_2O_3:Ga_2O_3:ZnO=1:1:2$ [molar ratio], a value of a band gap of a film formed by the deposition with an oxygen flow rate of 40 sccm is 3.2 eV, whereas a value of a band gap of a film formed by the deposition with a nitrogen flow rate of 40 sccm is 1.8 eV.

TABLE 1

| Deposition Target (molar ratio) | Deposition Gas | |
|---|---|---|
| | $O_2$: 40 sccm | $N_2$: 40 sccm |
| $In_2O_3:Ga_2O_3:ZnO = 1:1:2$ | 3.2 eV | 1.8 eV |
| $In_2O_3$ | 3.0 eV | 1.7 eV |
| $In_2O_3:SnO_2 = 83:17$ | 3.0 eV | 1.7 eV |
| $In_2O_3:Ga_2O_3 = 1:1$ | 3.3 eV | 2.2 eV |
| $In_2O_3:ZnO = 1:1$ | 2.7 eV | 1.6 eV |
| $SnO_2$ | 3.3 eV | 2.3 eV |

<Same Deposition Conditions>
Distance between Target and Substrate: 60 mm
Deposition Pressure: 0.4 Pa
Deposition Power: 500 W
Substrate Temperature: 400° C.

At the time of forming the first oxide semiconductor film 104, for example, the substrate is held in a treatment chamber that is maintained at reduced pressure, and the substrate is heated to a temperature higher than or equal to 100° C. and lower than or equal to 600° C., preferably higher than or equal to 200° C. and lower than or equal to 400° C. Then, a high-purity gas from which impurities such as hydrogen, water, a hydroxyl group, and hydride are removed is introduced while moisture remaining in the treatment chamber is removed, and the first oxide semiconductor film 104 is formed using a metal oxide as a target. By forming the first oxide semiconductor film 104 while the substrate 100 is maintained at high temperatures, it is possible to reduce the hydrogen concentration in the first oxide semiconductor film 104. In addition, the first oxide semiconductor film 104 can be a CAAC-OS film by heating the substrate to a temperature in the above range during formation of the first oxide semiconductor film 104.

A CAAC-OS film can be formed by the following three types of methods. The first method is to form the first oxide semiconductor film 104 at a temperature higher than or equal to 200° C. and lower than or equal to 450° C. The second method is to form a thin (e.g., about several nm) oxide semiconductor film and then perform heat treatment at a temperature higher than or equal to 200° C. and lower than or equal to 700° C. The third method is to form a thin (e.g., about several nm) oxide semiconductor film, perform heat treatment at a temperature higher than or equal to 200° C. and lower than or equal to 700° C., and form another oxide semiconductor film. In this embodiment, the second method is used for forming the first oxide semiconductor film 104.

As a target, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Further alternatively, a target having a composition ratio where $In_2O_3:ZnO=25:1$ to 1:4 [molar ratio] can be used.

Preheat treatment may be performed before the deposition of the first oxide semiconductor film 104, in order to remove moisture and the like which remains in the sputtering apparatus. For the preheat treatment, a method in which the inside of the treatment chamber is heated to a temperature higher than or equal to 200° C. and lower than or equal to 600° C. under reduced pressure, a method in which introduction and removal of nitrogen or an inert gas are repeated while the inside of the treatment chamber is heated, and the like can be given. After the preheat treatment, the substrate or the sputtering apparatus is cooled. After that, the first oxide semiconductor film 104 is deposited without exposure to the air. In this case, not water but oil or the like is preferably used as a coolant for the target. Although a certain level of effect can be obtained when introduction and removal of nitrogen are repeated without heating, it is more preferable to perform the treatment with the inside of the treatment chamber heated.

For removing moisture and the like which remain in the sputtering apparatus before, during, or after the deposition of the first oxide semiconductor film 104, an entrapment vacuum pump is preferably used for a vacuum pump provided for the treatment chamber. For example, a cryopump, an ion pump, a titanium sublimation pump, or the like may be used. Alternatively, a turbo pump provided with a cold trap may be used. Since hydrogen, water, and the like are removed from the treatment chamber which is removed with any of the above pumps, the impurity concentration in the first oxide semiconductor film 104 can be reduced.

For example, the first oxide semiconductor film 104 can be formed under the following conditions: a sputtering apparatus is used, the target is a metal oxide target having a composition ratio where $In_2O_3:Ga_2O_3:ZnO=1:1:2$ [molar ratio], the distance between the target and the substrate is 170 mm, the pressure is 0.4 Pa, the direct current (DC) power is 0.5 kW, and the atmosphere is a mixed atmosphere of nitrogen and oxygen (e.g., the flow rate of nitrogen is 50%). Note that a pulse direct current (DC) power source is preferably used because particles can be reduced and the film thickness can be uniform. An appropriate thickness differs depending on the oxide semiconductor material to be used, the usage, or the like; thus, the thickness may be determined as appropriate in accordance with the material, the usage, or the like.

Then, the first heat treatment is performed on the first oxide semiconductor film 104 after the film is formed to make the first oxide semiconductor film 104 a CAAC-OS film. Impurities such as water (including a hydroxyl group) and hydrogen in the first oxide semiconductor film 104 can be removed by the heat treatment.

The first heat treatment may be performed in an atmosphere selected from nitrogen, a rare gas, oxygen, a mixed gas of nitrogen or a rare gas and oxygen, and dry air. The first heat treatment is performed at a temperature higher than or equal to 400° C. and lower than or equal to 800° C., preferably higher than or equal to 550° C. and lower than or equal to 750° C. In addition, heating time is longer than or equal to 1 minute and shorter than or equal to 24 hours. In this embodiment, as the first heat treatment, heat treatment is performed in a nitrogen atmosphere at 700° C. for one hour, whereby dehydration or dehydrogenation is performed. After that, the atmosphere is changed to an oxygen atmosphere to supply oxygen to the inside of the oxide semiconductor film, so that oxygen defects generated by the removal of water, hydrogen, and the like can be filled. Thus, the first oxide semiconductor film 104 can be made to be i-type or substantially i-type.

Note that it is preferable that impurities such as hydrogen, water, a hydroxyl group, and hydride be not contained in nitrogen, oxygen, or a rare gas such as helium, neon, or argon which is used in the first heat treatment. Alternatively, it is preferable that the purity of nitrogen, oxygen, or a rare gas such as helium, neon, or argon which is introduced to a heat treatment apparatus be 6N (99.9999%) or higher, preferably 7N (99.99999%) or higher (that is, the impurity concentration is 1 ppm or lower, preferably 0.1 ppm or lower). The first heat treatment may be performed in an ultra-dry air with the water concentration of 20 ppm or lower, preferably in an ultra-dry air with the water concentration of 1 ppm or lower. By such first heat treatment, water (including a hydroxyl group), hydrogen, and the like contained in the first oxide semiconductor film can be removed.

Note that the heat treatment apparatus used for the first heat treatment is not limited to a particular apparatus, and an apparatus or the like for heating an object to be processed by thermal conduction or thermal radiation from a heater such as a resistance heater can be used. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The first oxide semiconductor film 104 is made to be a CAAC-OS film through the above-described steps, in which oxygen deficiency is reduced and hydrogen and water are removed. Although an example of forming a CAAC-OS film as the first oxide semiconductor film 104 is described in this embodiment, one embodiment of the present invention is not limited thereto. Note that it is preferable that the first oxide semiconductor film 104 be crystallized in the thickness direction at least 3 nm or more, preferably 5 nm or more from a surface (i.e., an interface with a second oxide semiconductor film 106 formed in a later step).

Figure 2B:
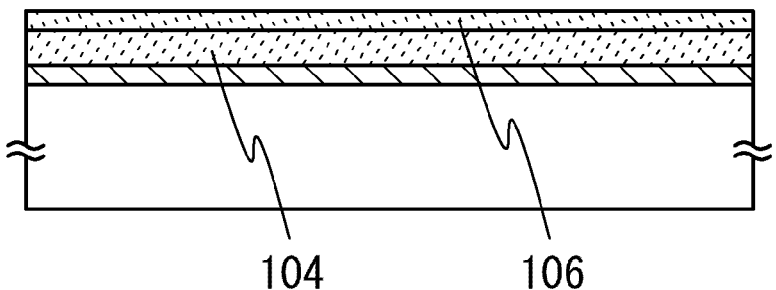

Next, the second oxide semiconductor film 106 is formed over the first oxide semiconductor film 104 (see FIG. 2B).

The second oxide semiconductor film 106 which is formed over the first oxide semiconductor film 104 can be formed using a material similar to the above-described material of the first oxide semiconductor film 104.

As the second oxide semiconductor film 106 formed here, it is preferable to use a film having a structure in which one or both of nitrogen and phosphorus are excluded from elements included in the first oxide semiconductor film 104. Accordingly, crystal growth in the second oxide semiconductor film 106 can be easily caused using the first oxide semiconductor film 104 as a seed crystal; thus, lattice constants can be close to each other (lattice mismatch of less than or equal to 1%, preferably less than or equal to 0.7%) and dangling bonds at the interface between the first oxide semiconductor film 104 and the second oxide semiconductor film 106 can be effectively reduced. Note that when the first oxide semiconductor film 104 and the second oxide semiconductor film 106 have the same axis orientation and close lattice constants (lattice mismatch of less than or equal to 1%) in the vicinity of the interface therebetween, a material (target) different from that of the first oxide semiconductor film 104 may be used for the second oxide semiconductor film 106.

Figure 12:
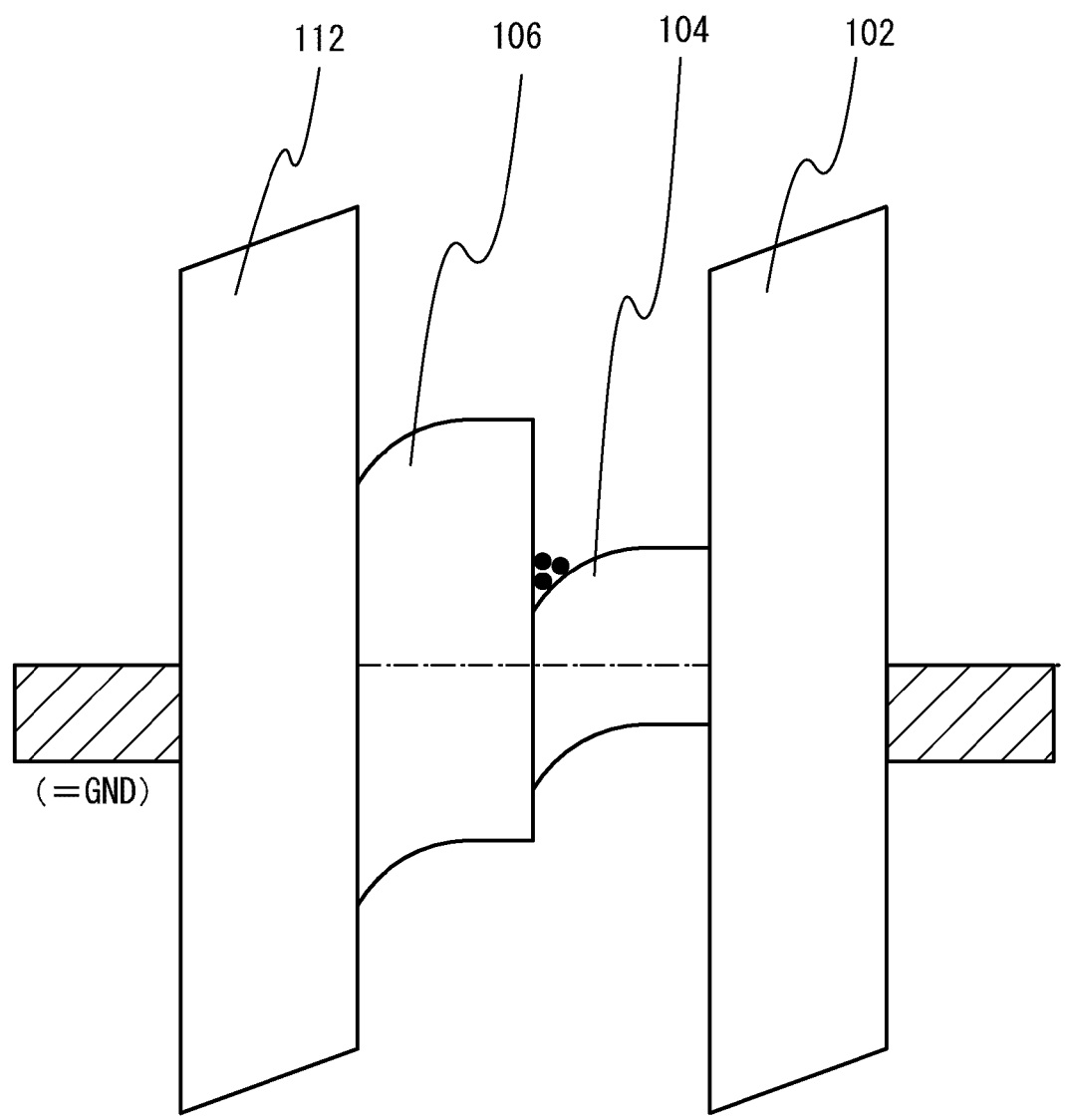
FIG. 12 is a band diagram.

A value of a band gap of the second oxide semiconductor film 106 needs to be larger by 0.2 eV or more, preferably by 0.4 eV or more than that of the first oxide semiconductor film 104. Further, a conduction band level of the first oxide semiconductor film 104 is lower than that of the second oxide semiconductor film 106. The value of a band gap of the second oxide semiconductor film 106 is different from that of the first oxide semiconductor film 104 so that carriers (black dots in FIG. 12) flow to the first oxide semiconductor film 104 side (i.e., a side of an oxide semiconductor film having a smaller band gap) in the vicinity of the interface between the second oxide semiconductor film 106 and the first oxide semiconductor film 104, as illustrated in a band diagram in FIG. 12. The kind of a film used as the second oxide semiconductor film 106 may be selected as appropriate from films having a band gap larger than a band gap of the first semiconductor film 104 by 0.2 eV or more, preferably by 0.4 eV or more, depending on the value of a band gap of the first oxide semiconductor film 104.

In the case of depositing a film having a structure in which one or both of nitrogen and phosphorus are excluded from elements included in the first oxide semiconductor film 104 as the second oxide semiconductor film 106, crystal growth in the second oxide semiconductor film 106 can be easily caused using the first oxide semiconductor film 104 as a seed crystal. In addition, crystal growth using the first oxide semiconductor film as a seed crystal is suitable for the application to power devices or the like since the thickness can be increased substantially in the above case. Further, favorable interface characteristics such as adhesiveness or favorable electrical characteristics can be obtained.

In this embodiment, the target for forming the second oxide semiconductor film 106 by a sputtering method is a metal oxide target having a composition ratio where $In_2O_3:Ga_2O_3:ZnO=1:1:2$ [molar ratio]. Deposition by a sputtering method may be performed in a manner similar to the deposition of the first oxide semiconductor film 104 over the substrate 100 with a rare gas (typically argon), oxygen, or a mixed gas of a rare gas (typically argon) and oxygen. Note that it is preferable to use a high-purity gas in which impurities such as hydrogen, water, a hydroxyl group, or hydride are reduced to such a degree that the concentration thereof can be expressed by the unit ppm (preferably, ppb). In this embodiment, deposition is performed while oxygen used as a sputtering gas is introduced into a sputtering apparatus at a flow rate of 40 sccm.

Then, second heat treatment similar to that performed on the first oxide semiconductor film 104 is performed on the second oxide semiconductor film 106 so that the second oxide semiconductor film 106 is made to be a CAAC-OS film in which oxygen deficiency is reduced and hydrogen and water are removed.

The second heat treatment is performed under a condition including one or more combinations of a temperature and an atmosphere where the temperature is selected from 400° C. to 800° C. inclusive and the atmosphere is selected from nitrogen, a rare gas, oxygen, a mixed gas of nitrogen or a rare gas and oxygen, and dry air. Heating time for crystallization of the second oxide semiconductor film is longer than or equal to 1 minute and shorter than or equal to 24 hours. In the case of using a heat treatment apparatus such as an electric furnace, the heating time is preferably longer than or equal to 5 hours and shorter than or equal to 20 hours, typically 10 hours. In the case of using an apparatus capable of rapid heating, such as an RTA apparatus, the heating time is longer than or equal to 1 minute and shorter than or equal to 30 minutes, preferably longer than or equal to 1 minute and shorter than or equal to 10 minutes, typically 5 minutes.

Note that in this embodiment, the second heat treatment includes two steps: a first step for promoting crystallization and dehydration or dehydrogenation of the second oxide semiconductor film 106, and a second step for filling oxygen defects in the crystallized second oxide semiconductor film 106. In this case, the first step is preferably performed at a temperature higher than or equal to 550° C. and lower than or equal to 800° C., further preferably higher than or equal to 600° C. and lower than or equal to 750° C.; and the second step is preferably performed at a temperature higher than or equal to 400° C. and lower than or equal to 600° C., further preferably higher than or equal to 450° C. and lower than or equal to 550° C.

In the first step, heat treatment is performed in a nitrogen atmosphere at 650° C. for 6 minutes with an RTA apparatus. In the second step, heat treatment is performed in a mixed gas atmosphere of oxygen and nitrogen at 450° C. for 60 minutes. The number of steps is not limited to two and may be increased in accordance with the conditions which can be adjusted as appropriate. For example, a condition for the first step and a condition for the second step may be repeatedly employed. Note that since high-temperature heat treatment in a nitrogen or rare gas atmosphere may result in an increase in oxygen deficiency, the second heat treatment is preferably finished under a heat treatment condition including an atmosphere containing oxygen. In addition, in the heat treatment in an atmosphere containing oxygen, the oxygen concentration in the atmosphere may be increased over heat treatment time. Further, a gas containing oxygen may be used as the atmosphere in the first step in order to promote crystallization and dehydration or dehydrogenation as well as to fill oxygen defects. In this case, the second and later steps may be omitted.

By such heat treatment in an atmosphere containing oxygen at a constant temperature, oxygen is efficiently supplied to fill oxygen defects in the oxide semiconductor.

Note that also in the second heat treatment, it is preferable that water, hydrogen, and the like be not contained in nitrogen, oxygen, or a rare gas such as helium, neon, or argon. Alternatively, it is preferable that the purity of nitrogen, oxygen, or a rare gas such as helium, neon, or argon which is introduced to a heat treatment apparatus be 6N or higher, preferably 7N or higher. The second heat treatment may be performed in an ultra-dry air with the water concentration of 20 ppm or lower, preferably in an ultra-dry air with the water concentration of 1 ppm or lower. By such second heat treatment, oxygen defects in the second oxide semiconductor film 106 can be filled. Thus, the second oxide semiconductor film 106 which is made to be i-type or substantially i-type can be formed.

The second heat treatment may be performed in such a manner that the atmosphere in a furnace is a nitrogen atmosphere at the time of increasing the temperature and the atmosphere is an oxygen atmosphere or an atmosphere containing oxygen at the time of performing cooling. By changing the atmosphere to an oxygen atmosphere after crystallization and dehydration or dehydrogenation in a nitrogen atmosphere, oxygen can be supplied to the second oxide semiconductor film 106.

In this manner, by the second heat treatment, the second oxide semiconductor film 106 formed over the first oxide semiconductor film 104 can be easily crystallized with the use of the first oxide semiconductor film 104 as a seed crystal. Further, by the second heat treatment, the first oxide semiconductor film 104 can be a crystal film having higher orientation. Note that the second oxide semiconductor film 106 is not necessarily crystallized in the entire film, and is preferably crystallized in the thickness direction at least 3 nm or more, preferably 5 nm or more from the interface with the first oxide semiconductor film 104.

In the case of a structure in which the first oxide semiconductor film 104 includes an amorphous region in the vicinity of the interface with the insulating layer 102, by the second heat treatment, crystal growth is caused from the crystal region formed on a surface of the first oxide semiconductor film 104 toward an bottom surface of the first oxide semiconductor film 104 and the amorphous region is crystallized in some cases. Note that the amorphous region remains in some cases depending on the material for forming the insulating layer 102, heat treatment conditions, or the like.

In the case of depositing a film having a structure in which one or both of nitrogen and phosphorus are excluded from elements included in the first oxide semiconductor film 104 as the second oxide semiconductor film 106, crystal growth in the second oxide semiconductor film 106 formed over the first oxide semiconductor film 104 is likely to be caused upward toward a surface of the second oxide semiconductor film 106 using the first oxide semiconductor film 104 as a seed.

Note that the heat treatment apparatus used for the second heat treatment can be used under conditions similar to those of the first heat treatment.

In this manner, the second oxide semiconductor film 106 is formed on and in contact with the first oxide semiconductor film 104, whereby dangling bonds in the first oxide semiconductor film 104 and the second oxide semiconductor film 106 are bonded to each other at the interface between the first oxide semiconductor film 104 and the second oxide semiconductor film 106. Further, with the use of a film having a structure in which one or both of nitrogen and phosphorus are excluded from elements included in the first oxide semiconductor film 104 as the second oxide semiconductor film 106 as in this embodiment, crystal growth in the second oxide semiconductor film 106 is easily caused because the second oxide semiconductor film 106 is formed using the crystal region in the first oxide semiconductor film 104 as a seed, and dangling bonds at the interface are efficiently bonded.

Note that although the second oxide semiconductor film 106 is formed using the first oxide semiconductor film 104 as a seed crystal in this embodiment, the first oxide semiconductor film 104 is not necessarily used as a seed crystal.

Figure 2C:
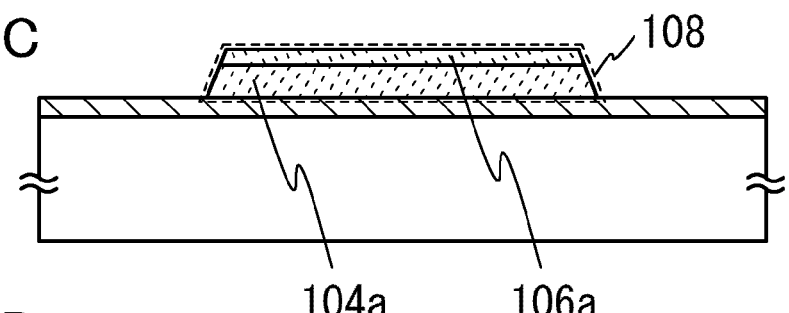

Next, the first oxide semiconductor film 104 and the second oxide semiconductor film 106 are processed by a method such as an etching method with the use of a photoresist mask, whereby an oxide semiconductor layer 108 having a stacked-layer structure of an island-shaped first oxide semiconductor film 104a and an island-shaped second oxide semiconductor film 106a is formed (see FIG. 2C).

As the etching method, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor films can be etched into desired shapes.

An example of an etching gas which can be used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). A gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may also be used.

As an etchant which can be used for wet etching, a mixed solution of phosphoric acid, acetic acid, and nitric acid; or an ammonia hydrogen peroxide mixture (hydrogen peroxide water of 31 wt %:ammonia water of 28 wt %:water=5:2:2) can be used. An etchant such as ITO-07N (produced by KANTO CHEMICAL CO., INC.) may also be used.

Figure 2D:
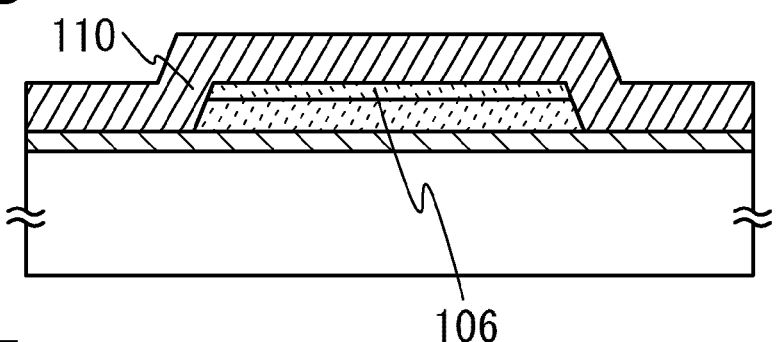

Then, a conductive layer 110 is formed to be in contact with the second oxide semiconductor film 106a (see FIG. 2D).

The conductive layer 110 can be formed by a PVD method such as a sputtering method, or a CVD method such as a plasma CVD method. The conductive layer 110 can be formed using an element selected from aluminum, chromium, copper, tantalum, titanium, molybdenum, and tungsten; an alloy containing any of these elements as a component; or the like. Alternatively, the conductive layer 110 may be formed using a material containing one or more of manganese, magnesium, zirconium, and beryllium. Further alternatively, a material containing aluminum and one or more of elements selected from titanium, tantalum, tungsten, molybdenum, chromium, neodymium, and scandium may be used. As another material of the conductive layer 110, a material having a high barrier property, such as titanium nitride or tantalum nitride, may be used. With the use of a material having a high barrier property, such as a titanium nitride film or a tantalum nitride film, in a portion which is in contact with the second oxide semiconductor film 106a, entry of impurities into the second oxide semiconductor film 106a can be reduced and an adverse effect on transistor characteristics can be prevented.

Alternatively, the conductive layer 110 may be formed using a conductive metal oxide. As a conductive metal oxide, indium oxide, tin oxide, zinc oxide, an indium tin oxide (which may be abbreviated to ITO), an indium zinc oxide, or any of these metal oxide materials containing silicon or silicon oxide can be used.

The conductive layer 110 preferably has a three-layer structure in which a titanium layer, an aluminum layer, and a titanium layer are stacked in this order. Alternatively, the conductive layer 110 can have a two-layer structure of an aluminum layer and a tungsten layer, a two-layer structure of a copper layer and a tungsten layer, or a two-layer structure of an aluminum layer and a molybdenum layer. It is needless to say that the conductive layer 110 can have a single-layer structure or a stacked-layer structure including four or more layers. In this embodiment, a single-layer structure of a titanium layer is applied. In the case of using a single-layer structure of a titanium layer, a favorable tapered shape can be obtained by etching to be performed later.

Figure 2E:
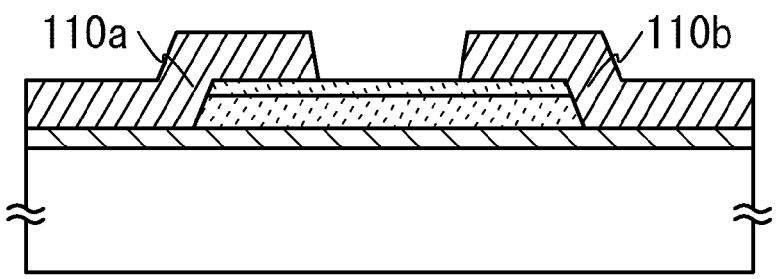

Next, the conductive layer 110 is selectively etched to form a source electrode layer 110a and a drain electrode layer 110b (see FIG. 2E). Note that in this specification, an electrode formed on the left side is the source electrode layer 110a and an electrode formed on the right side is the drain electrode layer 110b as illustrated in FIG. 2E; however, the source and drain electrodes can be reversed.

Ultraviolet light, KrF laser light, or ArF laser light is preferably used for light exposure for forming a photoresist mask for the etching. Particularly, in the case where light exposure is performed for a channel length (L) of less than 25 nm, light exposure for forming the mask is preferably performed with extreme ultraviolet light whose wavelength is several nanometers to several tens of nanometers, which is extremely short. In light exposure using extreme ultraviolet light, resolution is high and depth of focus is large. Accordingly, the channel length (L) of the transistor, which is completed later, can be greater than or equal to 10 nm and less than or equal to 1000 nm (1 µm). By a decrease in channel length by such a method, operation speed can be improved. In addition, an off-state current of a transistor including the above-described oxide semiconductor is extremely low; thus, an increase in power consumption due to miniaturization of the transistor can be suppressed.

The materials and etching conditions of the conductive layer 110 and the second oxide semiconductor film 106a are adjusted as appropriate so that the second oxide semiconductor film 106a is not removed in etching of the conductive layer 110. Note that in some cases, the second oxide semiconductor film 106a is partly etched in this step and thus has a groove portion (depressed portion) depending on the materials and etching conditions.

Portions in contact with the source electrode layer 110a or the drain electrode layer 110b may be amorphous on side surfaces of the first oxide semiconductor film 104a and the second oxide semiconductor film 106a in some cases.

Figure 3A:
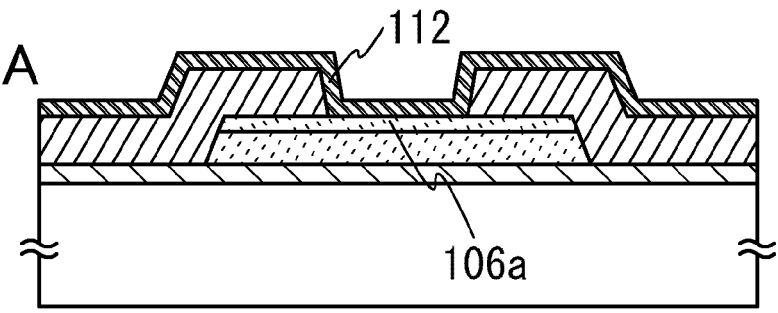
FIGS. 3A to 3D are views illustrating a method for manufacturing an oxide semiconductor element described in Embodiment 1.

Subsequently, a gate insulating layer 112 in contact with the second oxide semiconductor film 106a is formed (see FIG. 3A). The gate insulating layer 112 can be formed by a plasma CVD method, a sputtering method, or the like. The gate insulating layer 112 is preferably formed using silicon oxide, silicon oxynitride, silicon nitride oxide, aluminum oxide, hafnium oxide, tantalum oxide, or the like. Note that the gate insulating layer 112 may have a single-layer structure or a stacked-layer structure. In the case of a stacked-layer structure, any of the above materials is used for a layer in contact with an oxide semiconductor and a silicon nitride film can be stacked thereover. There is no particular limitation on the thickness of the gate insulating layer 112; for example, the gate insulating layer 112 can have a thickness of greater than or equal to 10 nm and less than or equal to 500 nm, preferably greater than or equal to 50 nm and less than or equal to 200 nm.

In this embodiment, a silicon oxide film is deposited by a sputtering method in an oxygen atmosphere to form the gate insulating layer 112. Oxygen can be supplied to a part of the second oxide semiconductor film 106a at the time of the deposition of the gate insulating layer 112.

A high-density plasma apparatus which can achieve a plasma density higher than or equal to $1\times10^{11}/cm^3$ may be used to form the gate insulating layer 112 which is dense and has high breakdown voltage and high-quality.

After that, third heat treatment may be performed in an inert gas atmosphere or an oxygen atmosphere. The third heat treatment is performed at a temperature higher than or equal to 200° C. and lower than or equal to 450° C., preferably higher than or equal to 250° C. and lower than or equal to 350° C. For example, the heat treatment may be performed in an atmosphere containing oxygen at 250° C. for one hour. By the third heat treatment, oxygen is supplied to the second oxide semiconductor film 106a, so that oxygen defects in the second oxide semiconductor film 106a can be filled.

Figure 3B:
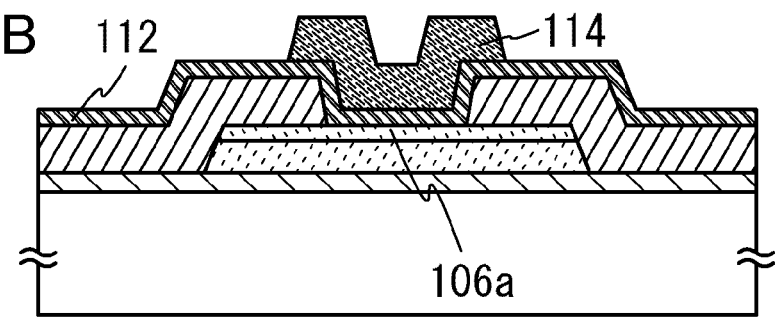

Next, a gate electrode 114 is formed in a region overlapping with the first oxide semiconductor film 104a and the second oxide semiconductor film 106a with the gate insulating layer 112 provided therebetween (see FIG. 3B). The gate electrode 114 can be formed in such a manner that a conductive layer is formed over the gate insulating layer 112 and then is selectively etched.

The above-described conductive layer can be formed by a PVD method such as a sputtering method, or a CVD method such as a plasma CVD method. The conductive layer can be formed using an element selected from aluminum, chromium, copper, tantalum, titanium, molybdenum, and tungsten; an alloy containing any of these elements as a component; or the like. Alternatively, titanium nitride, tantalum nitride, or the like, which is a nitride of any of the above-described elements, may be used. A material containing one or more of manganese, magnesium, zirconium, and beryllium may be used. Further alternatively, a material containing aluminum and one or more of elements selected from titanium, tantalum, tungsten, molybdenum, chromium, neodymium, and scandium may be used.

Figure 3C:
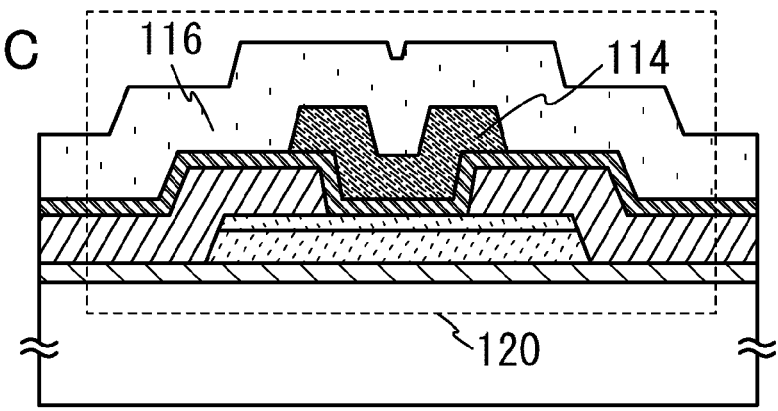

Then, a first interlayer insulating layer 116 is formed over the gate insulating layer 112 and the gate electrode 114 (see FIG. 3C). The first interlayer insulating layer 116 can be formed by a plasma CVD method or the like. In this embodiment, a silicon nitride film which is one of nitride insulating layers obtained by a plasma CVD method is used.

Note that fourth heat treatment may be performed after the first interlayer insulating layer 116 is formed. The fourth heat treatment is performed in a nitrogen atmosphere at a temperature higher than or equal to 150° C. and lower than or equal to 450° C., preferably higher than or equal to 250° C. and lower than or equal to 440° C. The atmosphere of the fourth heat treatment is not limited to a nitrogen atmosphere, and an oxygen atmosphere, a rare gas atmosphere, or a dry air atmosphere may be used. By the fourth heat treatment, impurities contained in the first interlayer insulating layer 116, which may adversely affect characteristics of the semiconductor element, such as moisture, can be removed. Thus, electrical characteristics and reliability of the semiconductor element can be improved.

Through the above steps, the top-gate transistor 120 according to one embodiment of the disclosed invention can be manufactured.

Figure 3D:
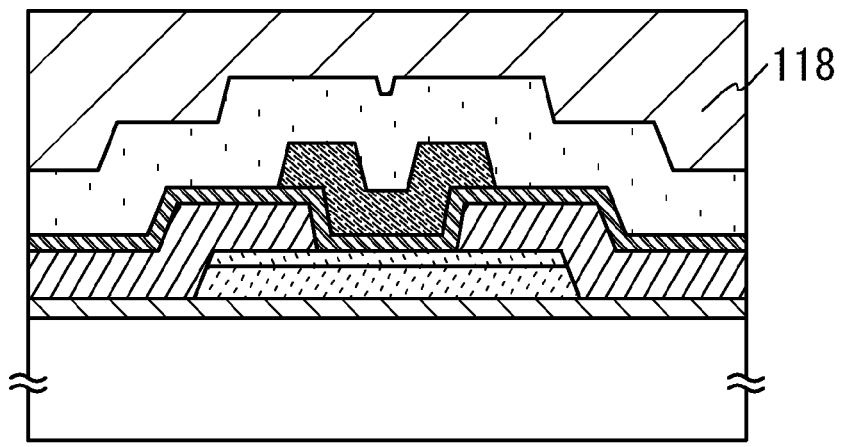

Note that a second interlayer insulating layer 118 may be additionally formed over the first interlayer insulating layer 116 in order to planarize a top surface (see FIG. 3D). The second interlayer insulating layer 118 is formed by a PVD method, a CVD method, or the like using a material containing an inorganic insulating material such as silicon oxide, silicon nitride oxide, silicon nitride, hafnium oxide, aluminum oxide, or tantalum oxide. Alternatively, an organic resin such as polyimide, acrylic, benzocyclobutene, polyamide, or epoxy can be used as a material of the interlayer insulating layer which is used to planarize the top surface. Note that although a stacked-layer structure of the first interlayer insulating layer 116 and the second interlayer insulating layer 118 is used in this embodiment, one embodiment of the present invention is not limited thereto. A single-layer structure or a stacked-layer structure including three or more layers can also be used.

The second interlayer insulating layer 118 is formed to planarize the top surface, whereby an electrode, a wiring, or the like can be favorably formed over the transistor 120.

The transistor 120 illustrated in FIG. 1B includes the oxide semiconductor layer 108 having the first oxide semiconductor film 104a and the second oxide semiconductor film 106a, which is formed over the substrate 100 with the insulating layer 102 provided therebetween; the gate insulating layer 112 formed over the oxide semiconductor layer 108; the gate electrode 114 formed in a region overlapping with the oxide semiconductor layer 108 with the gate insulating layer 112 provided therebetween; and the pair of source and drain electrode layers 110a and 110b, each of which is electrically connected to the oxide semiconductor layer 108.

Although not illustrated, the source electrode layer 110a and the drain electrode layer 110b may be electrically led over the second interlayer insulating layer 118 through a conductive wiring layer via a contact hole which is formed in a part of the gate insulating layer 112, the first interlayer insulating layer 116, and the second interlayer insulating layer 118. Similarly, the gate electrode 114 may be electrically led over the second interlayer insulating layer 118 through a conductive wiring layer via a contact hole which is formed in a part of the first interlayer insulating layer 116 and the second interlayer insulating layer 118.

In the first oxide semiconductor film 104a and the second oxide semiconductor film 106a, the carrier concentration is sufficiently low (e.g., lower than $1\times10^{12}/cm^3$, preferably lower than $1.45\times10^{10}/cm^3$) as compared with the carrier concentration of a general silicon wafer (approximately $1\times10^{14}/cm^3$). At drain voltage in the range from 1V to 10V, the off-state current (current flowing between the source and the drain when the gate-source voltage is 0V or less) can be less than or equal to $1\times10^{-13}$ A; or the off-state current density (a value obtained by dividing an off-state current by a channel width of a transistor) can be less than or equal to 10 aA/μm ("a" represents "atto" and denotes a factor of $10^{-18}$), preferably less than or equal to 1 aA/μm, further preferably less than or equal to 100 zA/μm ("z" represents "zepto" and denotes a factor of $10^{-21}$); in the case where the channel length is 10 μm and the total thickness of the oxide semiconductor layer is 30 nm. Note that the resistance at the time when the transistor is off (off-state resistance R) can be calculated using Ohm's law when the off-state current and the drain voltage are obtained. Further, the off-state resistivity ρ can be calculated using the formula ρ=RA/L (R is the off-state resistance), when a cross-section area A of the channel formation region and the channel length L are obtained. The off-state resistivity is preferably higher than or equal to $1\times10^9$ Ω·m (or higher than or equal to $1\times10^{10}$ Ω·m). Here, the cross-section area A can be calculated using the formula A=dW where d is a thickness of the channel formation region and W is the channel width.

The off-state current of a transistor including amorphous silicon is approximately $10^{-12}$ A, whereas the off-state current of a transistor including an oxide semiconductor is 1/10000 or less of that of the transistor including amorphous silicon. In this manner, by using an oxide semiconductor having a wide band gap and improved quality, the transistor 120 which has extremely favorable off-state current characteristics can be obtained.

A region serving as a channel region in the oxide semiconductor layer preferably includes at least a flat surface. Further, the first oxide semiconductor film and the second oxide semiconductor film are non-single-crystal films whose c-axes are aligned in the same direction. Note that the difference in height of the surface of the second oxide semiconductor film is preferably 1 nm or less (further preferably 0.2 nm or less) in a region overlapping with the gate electrode layer (the channel formation region).

Note that in the method for manufacturing the top-gate transistor (oxide semiconductor element) described above, the source electrode layer 110a and the drain electrode layer 110b are formed in contact with an upper side of the second oxide semiconductor film 106a included in the oxide semiconductor layer 108; however, the source electrode layer 110a and the drain electrode layer 110b may be formed in contact with a lower side of the first oxide semiconductor film 104a.

This embodiment can be implemented in appropriate combination with any of the structures described in the other embodiments.

Embodiment 2

In this embodiment, a method for forming the oxide semiconductor layer 108, which is different from that described in Embodiment 1, will be described with reference to FIGS. 4A to 4C.

<Method for Forming Oxide Semiconductor Layer 108 in Embodiment 2>

Figure 4A:
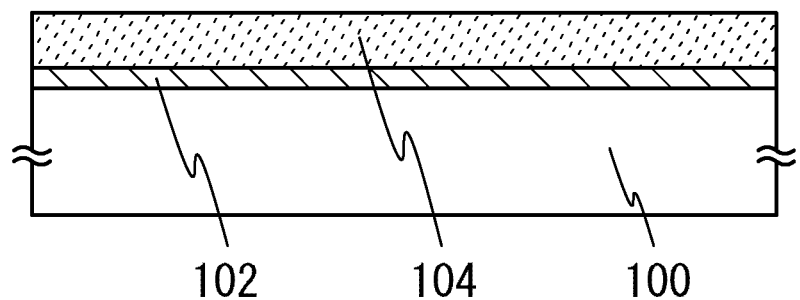
FIGS. 4A to 4C are views illustrating a method for forming an oxide semiconductor layer described in Embodiment 2.
Figure 4B:
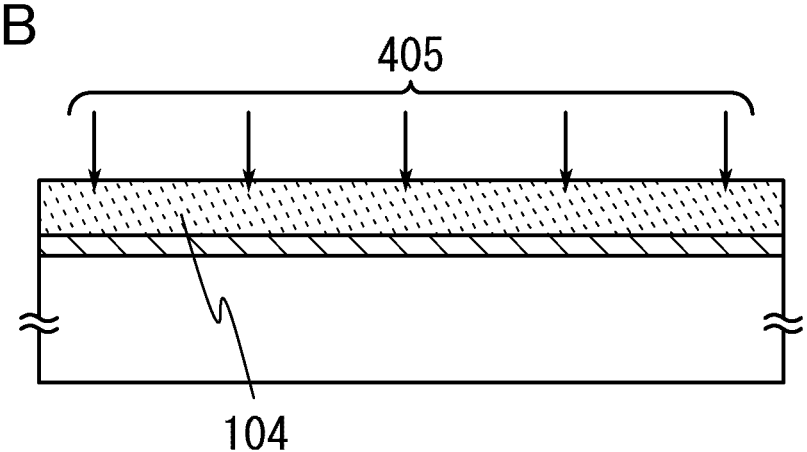
Figure 4C:
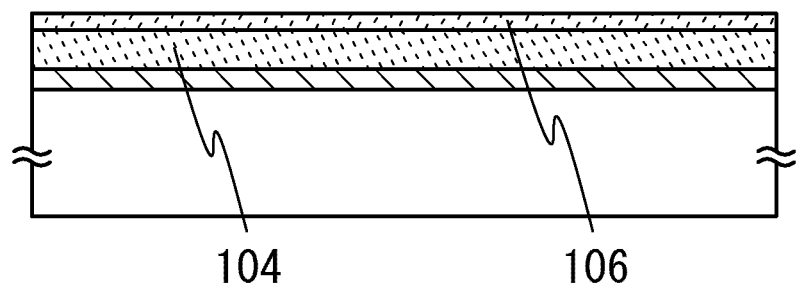

First, the insulating layer 102 is formed over the substrate 100, the first oxide semiconductor film 104 is deposited over the insulating layer 102, and a region including at least a surface of the first oxide semiconductor film 104 is crystallized by the first heat treatment (see FIG. 4A). FIG. 4A corresponds to FIG. 2A in Embodiment 1. Since the steps up to here are similar to that of Embodiment 1, the description is omitted here.

Next, impurity addition treatment 405 is performed on the first oxide semiconductor film 104 (see FIG. 4B), so that a region to which an impurity is added, which functions as the second oxide semiconductor film 106, is formed in the first oxide semiconductor film 104 from a surface (surface over which the gate insulating layer 112 is formed in a later step) (see FIG. 4C). Note that at least one of oxygen, boron, and aluminum may be used as an impurity to be added.

The impurity addition treatment 405 can be performed with an ion doping apparatus or an ion-implantation apparatus. As a typical example of an ion doping apparatus, there is a non-mass-separation type apparatus in which an object to be processed is irradiated with all kinds of ion species generated by plasma excitation of a process gas. In this apparatus, the object to be processed is irradiated with ion species of plasma without mass separation. In contrast, an ion implantation apparatus is a mass-separation-type apparatus. In an ion-implantation apparatus, mass separation of ion species of plasma is performed and the object to be processed is irradiated with ion species having predetermined masses.

In this embodiment, as the impurity addition treatment 405, an example of irradiating the first oxide semiconductor film 104 with an oxygen (O) gas using an ion doping apparatus will be described.

In the case of using oxygen as a source gas, the second oxide semiconductor film 106 may be formed in the first oxide semiconductor film 104 by performing the impurity addition treatment with acceleration voltage in the range from 10 kV to 100 kV, and the dose in the range from $1\times10^{15}$ ions/cm$^2$ to $1\times10^{17}$ ions/cm$^2$.

Through the above steps, a stacked-layer structure of the first oxide semiconductor film 104 and the second oxide semiconductor film 106, which is similar to FIG. 2B in Embodiment 1, is formed. Since the subsequent steps are similar to those of Embodiment 1, the description is omitted here.

Embodiment 3

In this embodiment, a method for forming the oxide semiconductor layer 108, which is different from that described in Embodiment 1, will be described with reference to FIGS. 5A to 5C.

<Method for Forming Oxide Semiconductor Layer 108 in Embodiment 3>

Figure 5A:
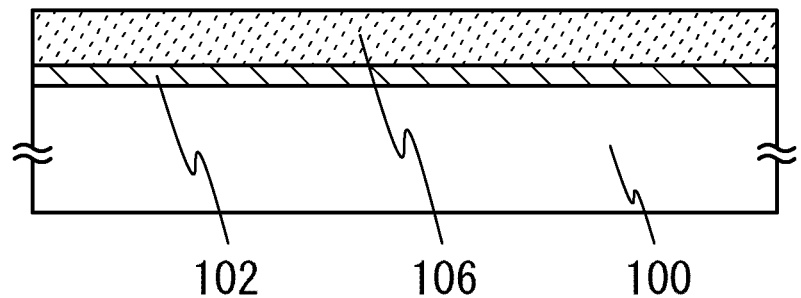
FIGS. 5A to 5C are views illustrating a method for forming an oxide semiconductor layer described in Embodiment 3.
Figure 5B:
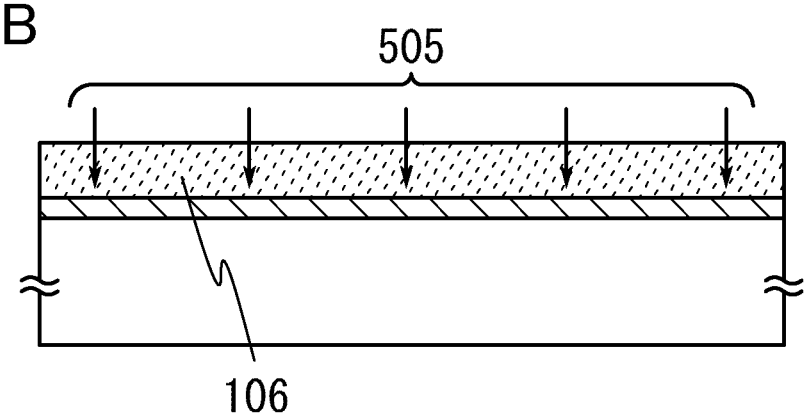

First, the insulating layer 102 is formed over the substrate 100, the second oxide semiconductor film 106 is deposited over the insulating layer 102, and the second oxide semiconductor film 106 is crystallized by the second heat treatment (see FIG. 5A). Note that deposition conditions, materials, processing methods, and the like used for components denoted by the same reference numerals as those in Embodiment 1 are the same as those in Embodiment 1. Therefore, description thereof is omitted here.

Figure 5C:
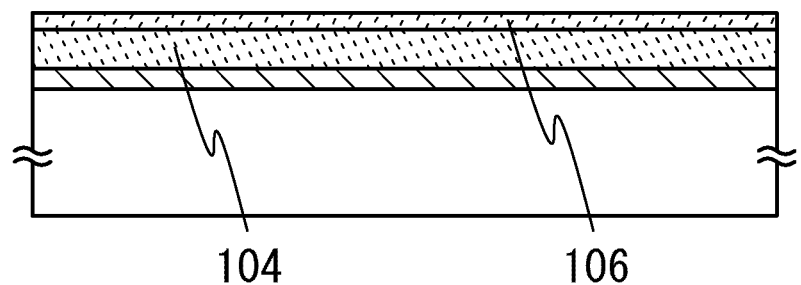

Next, the impurity addition treatment 505 is performed on the second oxide semiconductor film 106 (see FIG. 5B), so that a region to which an impurity is added, which functions as the first oxide semiconductor film 104, is formed in the second oxide semiconductor film 106 from a rear surface (surface in contact with the insulating layer 102) (see FIG. 5C). Note that at least one of nitrogen and phosphorus may be used as an impurity to be added.

The impurity addition treatment 505 can be performed with an ion doping apparatus or an ion-implantation apparatus. As a typical example of an ion doping apparatus, there is a non-mass-separation type apparatus in which an object to be processed is irradiated with all kinds of ion species generated by plasma excitation of a process gas. In this apparatus, the object to be processed is irradiated with ion species of plasma without mass separation. In contrast, an ion implantation apparatus is a mass-separation-type apparatus. In an ion-implantation apparatus, mass separation of ion species of plasma is performed and the object to be processed is irradiated with ion species having predetermined masses.

In this embodiment, as the impurity addition treatment 505, an example of irradiating the second oxide semiconductor film 106 with a nitrogen (N) gas using an ion doping apparatus will be described.

In the case of using nitrogen as a source gas, the first oxide semiconductor film 104 may be formed in the second oxide semiconductor film 106 by performing the impurity addition treatment with acceleration voltage in the range from 10 kV to 100 kV, and the dose in the range from $1 \times 10^{15}$ ions/cm$^2$ to $1 \times 10^{17}$ ions/cm$^2$.

Note that since nitrogen is an inert gas, a gas atmosphere and temperatures during ion irradiation are easily controlled; thus, work efficiency and safety can be improved.

Through the above steps, a stacked-layer structure of the first oxide semiconductor film 104 and the second oxide semiconductor film 106 is formed. Since the subsequent steps are similar to those of Embodiment 1, the description is omitted here.

Embodiment 4

In this embodiment, an oxide semiconductor element which is different from that described in Embodiment 1 and manufacturing method thereof will be described with reference to FIGS. 6A and 6B and FIGS. 7A to 7C.
<Method for Manufacturing Oxide Semiconductor Element in Embodiment 4>

Figure 6A:
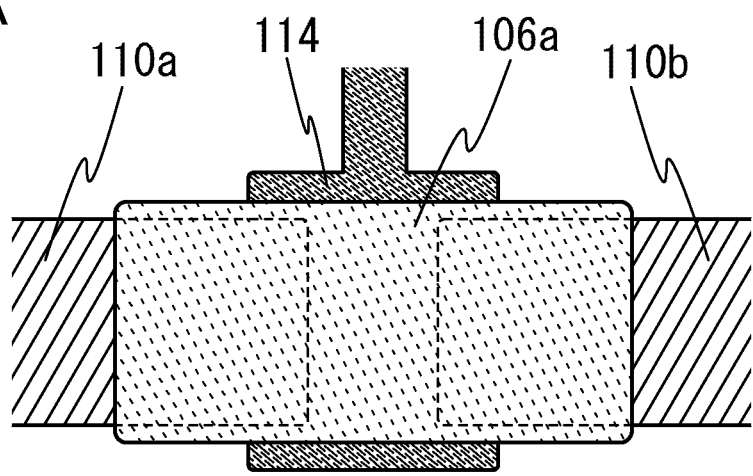
FIGS. 6A and 6B are views illustrating a structure of an oxide semiconductor element described in Embodiment 4.
Figure 6B:
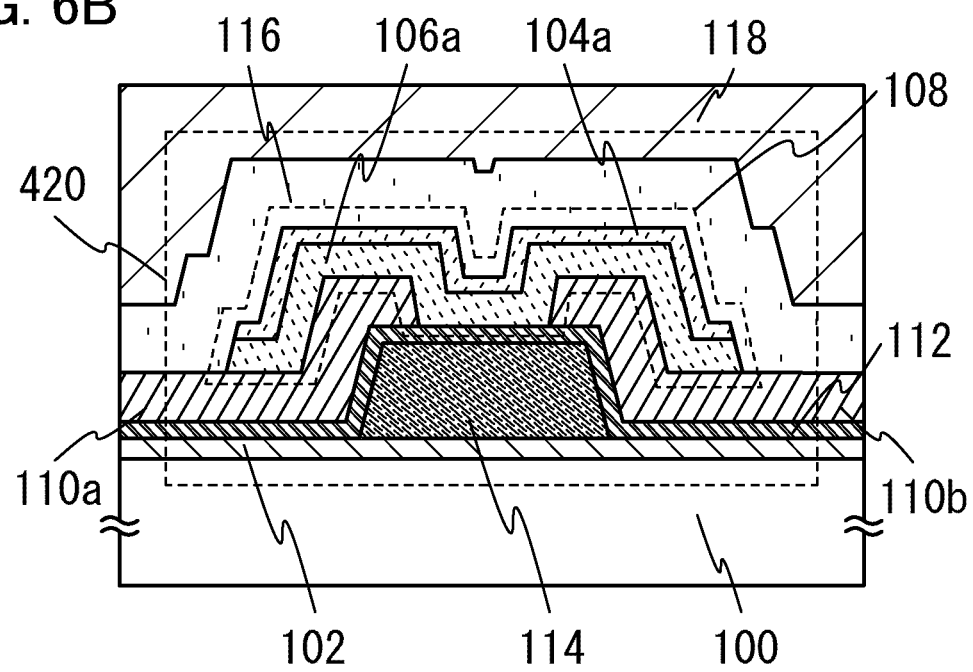

FIGS. 6A and 6B are views illustrating a bottom-gate transistor 420 which is an example of a structure of a semiconductor device manufactured by a method in this embodiment. FIGS. 6A and 6B are a top view and a cross-sectional view of the transistor 420, respectively. Note that some components (the substrate 100, for example) are omitted in FIG. 6A to avoid complication. Although a method for manufacturing an n-channel transistor whose carriers are electrons will be described as the transistor 420 in this embodiment, the transistor 420 is not limited to the n-channel transistor.

A method for manufacturing the transistor 420 will be described below with reference to FIGS. 7A to 7C.

Figure 7A:
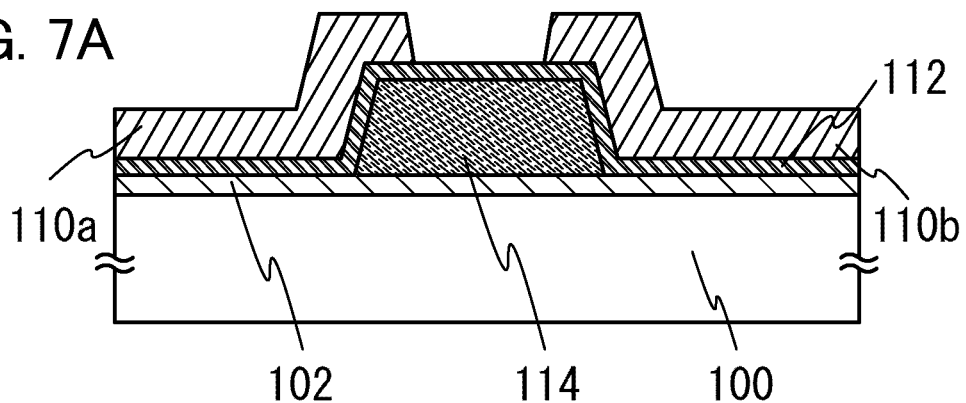
FIGS. 7A to 7C are views illustrating a method for manufacturing an oxide semiconductor element described in Embodiment 4.
Figure 7B:
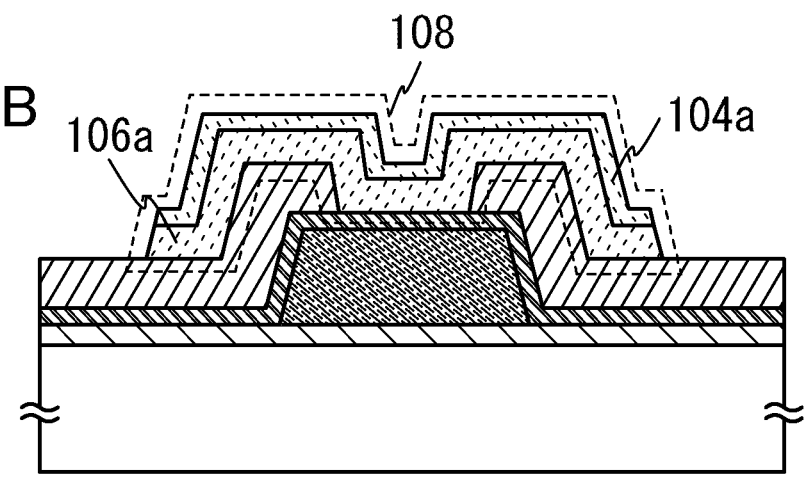
Figure 7C:
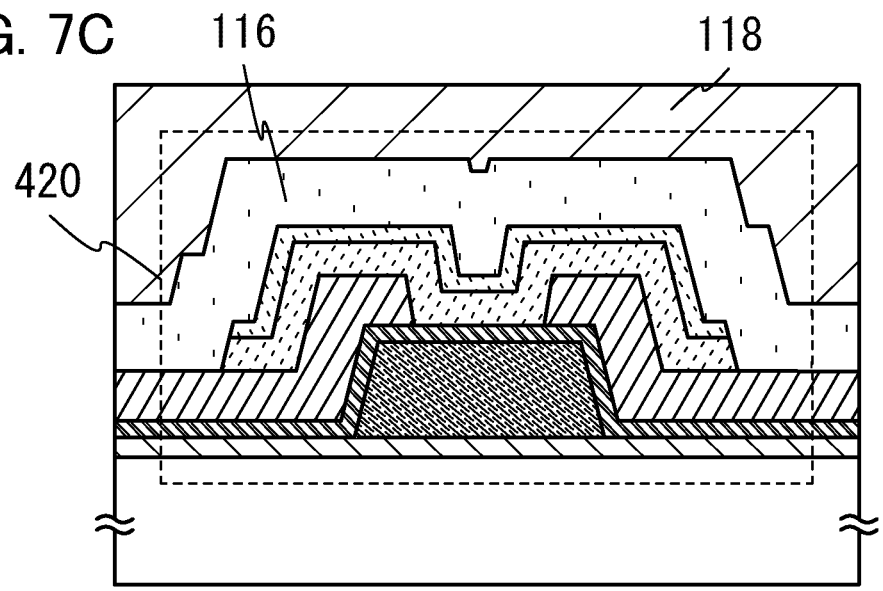

First, the insulating layer 102 is formed over the substrate 100, the gate electrode 114 is formed over the insulating layer 102, the gate insulating layer 112 is formed over the gate electrode 114, and the source electrode layer 110a and the drain electrode layer 110b are formed over the gate insulating layer 112 (see FIG. 7A). Note that deposition conditions, materials, processing methods, and the like used for components denoted by the same reference numerals as those in Embodiment 1 are the same as those in Embodiment 1. Therefore, description thereof is omitted here.

Next, the second oxide semiconductor film 106 described in Embodiment 1 is deposited over the gate insulating layer 112, and a region including at least a surface of the second oxide semiconductor film 106 is crystallized by the second heat treatment. Then, the first oxide semiconductor film 104 described in Embodiment 1 is deposited and the first heat treatment is performed. Further, the first oxide semiconductor film 104 and the second oxide semiconductor film 106 are patterned, so that the oxide semiconductor layer 108 including the island-shaped first oxide semiconductor film 104a and the island-shaped second oxide semiconductor film 106a is formed (see FIG. 7B). Note that deposition conditions, materials, processing methods, and the like used for components denoted by the same reference numerals as those in Embodiment 1 are the same as those in Embodiment 1. Therefore, description thereof is omitted here.

Then, the first interlayer insulating layer 116 is formed over the oxide semiconductor layer 108. In this manner, the bottom-gate transistor 420 according to one embodiment of the disclosed invention can be formed. In addition, as in Embodiment 1, the second interlayer insulating layer 118 which is in contact with the first interlayer insulating layer 116 may be formed for planarization (see FIG. 7C). Note that deposition conditions, materials, processing methods, and the like used for components denoted by the same reference numerals as those in Embodiment 1 are the same as those in Embodiment 1. Therefore, description thereof is omitted here.

The transistor 420 illustrated in FIGS. 6A and 6B includes the gate electrode 114 formed over the substrate 100 with the insulating layer 102 provided therebetween; the gate insulating layer 112 formed over the gate electrode 114; the oxide semiconductor layer 108 including the island-shaped first oxide semiconductor film 104a and the island-shaped second oxide semiconductor film 106a, which is formed over the gate insulating layer 112; and the pair of source and drain electrode layers 110a and 110b, each of which is electrically connected to the oxide semiconductor layer 108.

Although not illustrated, the source electrode layer 110a and the drain electrode layer 110b may be electrically led over the second interlayer insulating layer 118 through a conductive wiring layer via a contact hole which is formed in a part of the first interlayer insulating layer 116 and the second interlayer insulating layer 118. Similarly, the gate electrode 114 may be electrically led over the second interlayer insulating layer 118 through a conductive wiring layer via a contact hole which is formed in a part of the gate insulating layer 112, the first interlayer insulating layer 116, and the second interlayer insulating layer 118.

In the first oxide semiconductor film 104a and the second oxide semiconductor film 106a, the carrier concentration is sufficiently low (e.g., lower than $1 \times 10^{12}$/cm$^3$, preferably lower than $1.45 \times 10^{10}$/cm$^3$) as compared with the carrier concentration of a general silicon wafer (approximately $1 \times 10^{14}$/cm$^3$). At drain voltage in the range from 1V to 10V, the off-state current (current flowing between the source and the drain when the gate-source voltage is 0V or less) can be less than or equal to $1 \times 10^{-13}$ A; or the off-state current density (a value obtained by dividing an off-state current by a channel width of a transistor) can be less than or equal to 10 aA/µm ("a" represents "atto" and denotes a factor of $10^{-18}$), preferably less than or equal to 1 aA/µm, further preferably less than or equal to 100 zA/µm ("z" represents "zepto" and denotes a factor of $10^{-21}$); in the case where the channel length is 10 µm and the total thickness of the oxide semiconductor layer is 30 nm. Note that the resistance at the time when the transistor is off (off-state resistance R) can be calculated using Ohm's law when the off-state current and the drain voltage are obtained. Further, the off-state resistivity ρ can be calculated using the formula ρ=RA/L (R is the off-state resistance), when a cross-section area A of the channel formation region and the channel length L are obtained. The off-state resistivity is preferably higher than or equal to $1 \times 10^9$ Ω·m (or higher than or equal to $1 \times 10^{10}$ Ω·m). Here, the cross-section area A can be calculated using the formula A=dW where d is a thickness of the channel formation region and W is the channel width.

The off-state current of a transistor including amorphous silicon is approximately $10^{-12}$ A, whereas the off-state current of a transistor including an oxide semiconductor is 1/10000 or less of that of the transistor including amorphous silicon. In this manner, by using an oxide semiconductor having a wide band gap and improved quality, the transistor 420 which has extremely favorable off-state current characteristics can be obtained.

Note that in the method for manufacturing the bottom-gate transistor (oxide semiconductor element) described above, the source electrode layer 110a and the drain electrode layer 110b are formed in contact with a lower side of the second oxide semiconductor film 106a; however, the source electrode layer 110a and the drain electrode layer 110b may be formed in contact with an upper side of the first oxide semiconductor film 104a.

In this embodiment, since a step of patterning is not performed after the oxide semiconductor layer 108 is formed, the oxide semiconductor layer 108 is not damaged by etching treatment and the like at the time of patterning.

This embodiment can be implemented in appropriate combination with any of the structures described in the other embodiments.

Embodiment 5

In this embodiment, an oxide semiconductor element which is different from that described in Embodiment 1 and manufacturing method thereof will be described with reference to FIGS. 8A and 8B, FIGS. 9A to 9D, and FIGS. 10A and 10B.

<Method for Manufacturing Oxide Semiconductor Element in Embodiment 5>

Figure 8A:
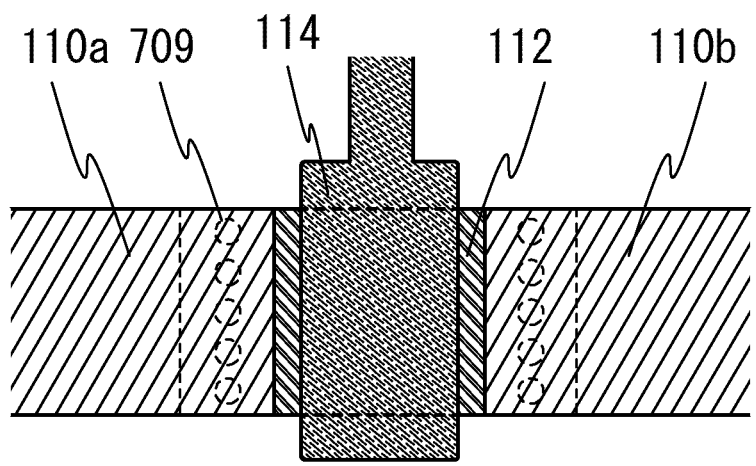
FIGS. 8A and 8B are views illustrating a structure of an oxide semiconductor element described in Embodiment 5.
Figure 8B:
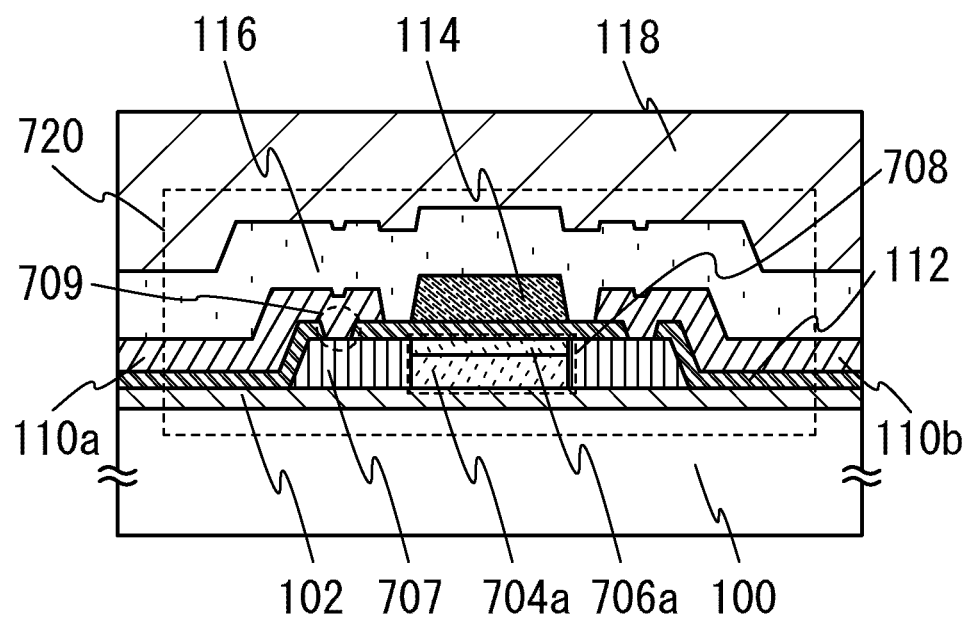

FIGS. 8A and 8B are views illustrating a transistor 720 which is an example of a structure of a semiconductor device manufactured by a method in this embodiment. FIGS. 8A and 8B are a top view and a cross-sectional view of the transistor 720, respectively. Note that some components (the substrate 100, for example) are omitted in FIG. 8A to avoid complication. Although a method for manufacturing an n-channel transistor whose carriers are electrons will be described as the transistor 720 in this embodiment, the transistor 720 is not limited to the n-channel transistor.

Figure 9A:
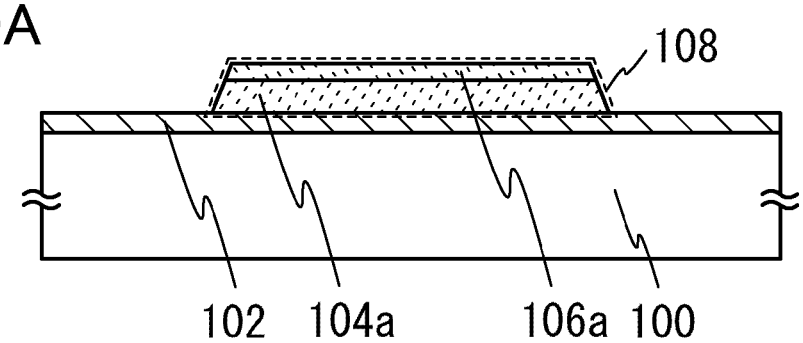
FIGS. 9A to 9D are views illustrating a method for manufacturing an oxide semiconductor element described in Embodiment 5.

First, the insulating layer 102 is formed over the substrate 100, the first oxide semiconductor film 104 is deposited over the insulating layer 102, and a region including at least a surface of the first oxide semiconductor film 104 is crystallized by the first heat treatment. Then, the second oxide semiconductor film 106 is deposited over the first oxide semiconductor film 104, and the second oxide semiconductor film 106 is crystallized by the second heat treatment. The first oxide semiconductor film 104 and the second oxide semiconductor film 106 are processed by a method such as an etching method with the use of a photoresist mask, whereby an oxide semiconductor layer 108 having a stacked-layer structure of an island-shaped first oxide semiconductor film 104a and an island-shaped second oxide semiconductor film 106a is formed (see FIG. 9A). FIG. 9A corresponds to FIG. 2C in Embodiment 1. Since the steps up to here are similar to that of Embodiment 1, the description is omitted here.

Figure 9B:
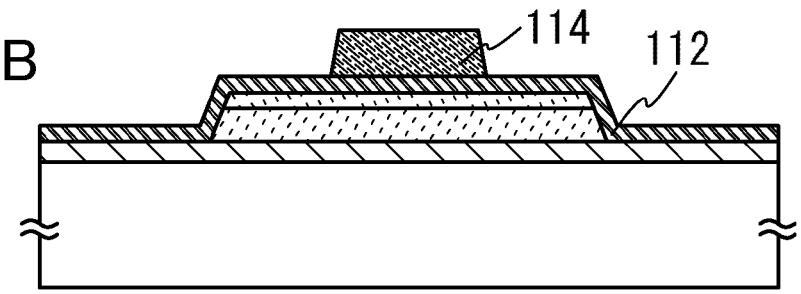
Figure 9C:
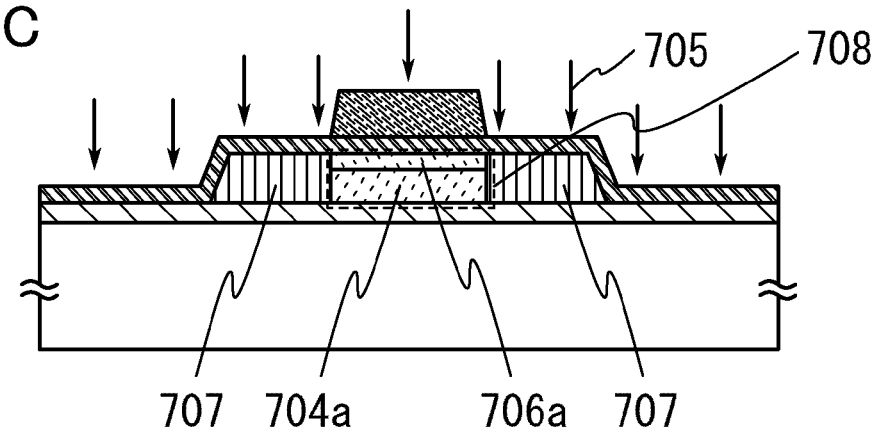

Next, the gate insulating layer 112 is formed, and the gate electrode 114 is formed in a region overlapping with the first oxide semiconductor film 104a and the second oxide semiconductor film 106a with the gate insulating layer 112 provided therebetween (see FIG. 9B). Note that deposition conditions, materials, processing methods, and the like used for components denoted by the same reference numerals as those in Embodiment 1 are the same as those in Embodiment 1. Therefore, description thereof is omitted here.

After that, impurity addition treatment 705 is performed on a region including the oxide semiconductor layer 108. Accordingly, in the oxide semiconductor layer 108, an impurity is added through the gate insulating layer 112 to a region over which the gate electrode is not formed; thus, low-resistance regions 707 are formed. Further, impurity addition is blocked by the gate electrode 114 in a region over which the gate electrode is formed; thus, an oxide semiconductor layer 708 having a first oxide semiconductor film 704a whose side surfaces are in contact with the low-resistance regions and a second oxide semiconductor film 706a whose side surfaces are in contact with the low-resistance regions is formed (see FIG. 9C). Note that at least one element selected from rare gases such as argon (Ar), krypton (Kr), and xenon (Xe); and Group 15 elements such as nitrogen (N), phosphorus (P), arsenic (As), and antimony (Sb) may be used as an impurity to be added.

The impurity addition treatment can be performed with an ion doping apparatus or an ion-implantation apparatus. As a typical example of an ion doping apparatus, there is a non-mass-separation type apparatus in which an object to be processed is irradiated with all kinds of ion species generated by plasma excitation of a process gas. In this apparatus, the object to be processed is irradiated with ion species of plasma without mass separation. In contrast, an ion implantation apparatus is a mass-separation-type apparatus. In an ion-implantation apparatus, mass separation of ion species of plasma is performed and the object to be processed is irradiated with ion species having predetermined masses.

In this embodiment, as the impurity addition treatment, an example of irradiating a region including a portion where the oxide semiconductor layer 708 is to be formed, with an argon (Ar) gas using an ion doping apparatus will be described.

In the case of using argon as a source gas, the low-resistance regions 707 are formed by performing irradiation with acceleration voltage in the range from 0.1 kV to 100 kV and the dose in the range from $1\times10^{14}$ ions/cm$^2$ to $1\times10^{17}$ ions/cm$^2$. Resistivity of each of the pair of the low-resistance regions 707 is preferably higher than or equal to $1\times10^{-4}$ $\Omega\cdot$cm and lower than or equal to 3 $\Omega\cdot$cm, further preferably higher than or equal to $1\times10$ $\Omega\cdot$cm and lower than or equal to $3\times10^{-1}$ $\Omega\cdot$cm. Further, the oxide semiconductor layer 708 having the first oxide semiconductor film 704a whose side surfaces are in contact with the low-resistance regions and the second oxide semiconductor film 706a whose side surfaces are in contact with the low-resistance regions is formed under the gate electrode 114 in a self-aligned manner.

As described above, by performing the impurity addition treatment 705, the low-resistance regions 707 and the oxide semiconductor layer 708 are formed from one film (i.e., a stacked film of the first oxide semiconductor film 104a and the second oxide semiconductor film 106a) in a self-aligned manner. Thus, an interface between the low-resistance regions 707 and the gate insulating layer 112, and an interface between the oxide semiconductor layer 708 and the gate insulating layer 112 are coplanar.

The lower limit of the resistivity of each of the pair of the low-resistance regions 707 is a possible lower limit which can be obtained by impurity addition performed with an ion doping apparatus or the like. The lower limit may be further lowered with the development of apparatus technology. Further, when resistivity of each of the pair of the low-resistance regions 707 is within the above range, resistance between the channel formation region and the source and drain electrode layers 110a and 110b which are formed in a later step can be reduced. Accordingly, a reduction in on-state current, which occurs between the source electrode layer 110a and the channel region and between the drain electrode layer 110b and the channel region, can be suppressed. Thus, an oxide semiconductor element having a high on-off ratio can be provided.

Note that since argon is an inert gas, a gas atmosphere and temperatures during ion irradiation are easily controlled; thus, work efficiency and safety can be improved.

Figure 9D:
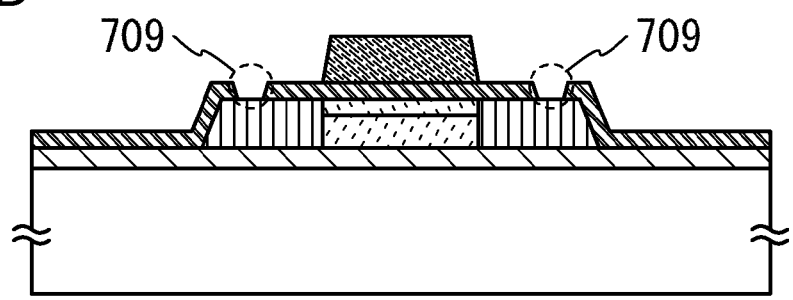

Then, by a method such as an etching method with the use of a photoresist mask, opening portions 709 are formed in the gate insulating layer 112 which is formed over the low-resistance regions 707 (see FIG. 9D).

As the etching method, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor films can be etched into desired shapes.

An example of an etching gas which can be used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). A gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may also be used.

As an etchant which can be used for wet etching, a mixed solution of phosphoric acid, acetic acid, and nitric acid; or an ammonia hydrogen peroxide mixture (hydrogen peroxide water of 31 wt %:ammonia water of 28 wt %:water=5:2:2) can be used. An etchant such as ITO-07N (produced by KANTO CHEMICAL CO., INC.) may also be used.

Figure 10A:
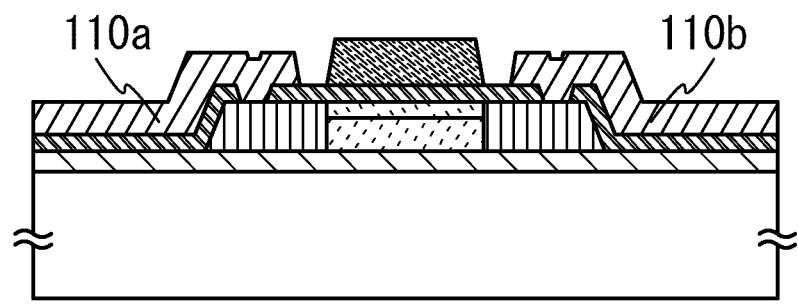
FIGS. 10A and 10B are views illustrating a method for manufacturing an oxide semiconductor element described in Embodiment 5.
Figure 10B:
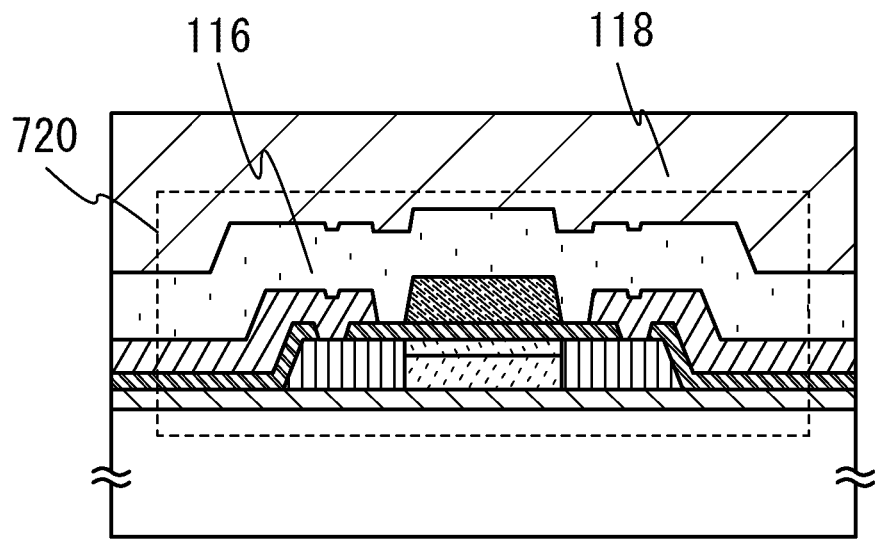

Next, a conductive layer is deposited and selectively etched to form a source electrode layer 110a and a drain electrode layer 110b (see FIG. 10A). Thus, the source electrode layer 110a and the drain electrode layer 110b are formed so as to be in contact with the low-resistance regions 707. In this specification, an electrode formed on the left side is the source electrode layer 110a and an electrode formed on the right side is the drain electrode layer 110b as illustrated in FIG. 10A; however, the source and drain electrodes can be reversed. Note that deposition conditions, materials, processing methods, and the like used for components denoted by the same reference numerals as those in Embodiment 1 are the same as those in Embodiment 1. Therefore, description thereof is omitted here.

Then, the first interlayer insulating layer 116 is formed over the source electrode layer 110a, the drain electrode layer 110b, the gate insulating layer 112, and the gate electrode 114. Through the above steps, the transistor 720 according to one embodiment of the disclosed invention can be manufactured. The second interlayer insulating layer 118 may be additionally formed over the first interlayer insulating layer 116 in order to planarize a top surface (see FIG. 10B). Note that deposition conditions, materials, processing methods, and the like used for components denoted by the same reference numerals as those in Embodiment 1 are the same as those in Embodiment 1. Therefore, description thereof is omitted here.

The transistor 720 illustrated in FIG. 8B includes the oxide semiconductor layer 708 having the first oxide semiconductor film 704a and the second oxide semiconductor film 706a, which is formed over the substrate 100 with the insulating layer 102 provided therebetween; the low-resistance regions 707 each of which is in contact with a side surface of the oxide semiconductor layer 708; the gate insulating layer 112 formed over the oxide semiconductor layer 708 and the low-resistance regions 707; the gate electrode 114 formed in a region overlapping with the oxide semiconductor layer 708 with the gate insulating layer 112 provided therebetween; and the pair of source and drain electrode layers 110a and 110b, each of which is electrically connected to the low-resistance regions 707.

Although not illustrated, the source electrode layer 110a, the drain electrode layer 110b, and the gate electrode 114 may be electrically led over the second interlayer insulating layer 118 through a conductive wiring layer via a contact hole which is formed in a part of the first interlayer insulating layer 116 and the second interlayer insulating layer 118.

In the first oxide semiconductor film 704a and the second oxide semiconductor film 706a, the carrier concentration is sufficiently low (e.g., lower than $1 \times 10^{12}/cm^3$, preferably lower than $1.45 \times 10^{10}/cm^3$) as compared with the carrier concentration of a general silicon wafer (approximately $1 \times 10^{14}/cm^3$). At drain voltage in the range from 1V to 10V, the off-state current (current flowing between the source and the drain when the gate-source voltage is 0V or less) can be less than or equal to $1 \times 10^{-13}$ A; or the off-state current density (a value obtained by dividing an off-state current by a channel width of a transistor) can be less than or equal to 10 aA/µm ("a" represents "atto" and denotes a factor of $10^{-18}$), preferably less than or equal to 1 aA/µm, further preferably less than or equal to 100 zA/µm ("z" represents "zepto" and denotes a factor of $10^{-21}$); in the case where the channel length is 10 µm and the total thickness of the oxide semiconductor layer is 30 nm. Note that the resistance at the time when the transistor is off (off-state resistance R) can be calculated using Ohm's law when the off-state current and the drain voltage are obtained. Further, the off-state resistivity ρ can be calculated using the formula ρ=RA/L (R is the off-state resistance), when a cross-section area A of the channel formation region and the channel length L are obtained. The off-state resistivity is preferably higher than or equal to $1 \times 10^9$ Ω·m (or higher than or equal to $1 \times 10^{10}$ Ω·m). Here, the cross-section area A can be calculated using the formula A=dW where d is a thickness of the channel formation region and W is the channel width.

The off-state current of a transistor including amorphous silicon is approximately $10^{-12}$ A, whereas the off-state current of a transistor including an oxide semiconductor is 1/10000 or less of that of the transistor including amorphous silicon. In this manner, by using an oxide semiconductor having a wide band gap and improved quality, the transistor 720 which has extremely favorable off-state current characteristics can be obtained.

Note that although in this embodiment, the first oxide semiconductor film 104 and the second oxide semiconductor film 106 are formed using the same material, the first oxide semiconductor film 104 and the second oxide semiconductor film 106 may be formed using different materials. In the case where the first oxide semiconductor film 104 and the second oxide semiconductor film 106 are formed using different materials (i.e., in the case of heteroepitaxial growth), for example, the first oxide semiconductor film 104 can be formed using In—Zn—O which is a two-component metal oxide, and the second oxide semiconductor film 106 can be formed using In—Ga—Zn—O which is a three-component metal oxide.

A region serving as a channel region in the oxide semiconductor layer preferably includes at least a flat surface. Note that the difference in height of the surface of the second oxide semiconductor film is preferably 1 nm or less (further preferably 0.2 nm or less) in a region overlapping with the gate electrode layer (the channel formation region).

According to this embodiment, a channel region is formed in a region with less dangling bonds, which is in the first oxide semiconductor film 704a and is in the vicinity of an interface with the second oxide semiconductor film 706a. Thus, an oxide semiconductor element having high mobility, in which the threshold voltage is not changed by light irradiation can be provided.

Further, in this embodiment, resistance between the channel formation region and the source and drain electrode layers 110a and 110b can be reduced. Accordingly, a reduction in on-state current, which occurs between the source electrode layer 110a and the channel region and between the drain electrode layer 110b and the channel region, can be suppressed. Thus, an oxide semiconductor element having a high on-off ratio can be provided.

This embodiment can be implemented in appropriate combination with any of the structures described in the other embodiments.

Embodiment 6

An oxide semiconductor element disclosed in this specification can be applied to a variety of electronic devices (including game machines). Examples of the electronic devices are a television device, a monitor of a computer or the like, a camera such as a digital camera or a digital video camera, a digital photo frame, a mobile phone (also referred to as a cellular phone or a cellular phone device), a portable game console, a portable information terminal, an audio reproducing device, a large-sized game machine such as a pachinko machine, and the like. Examples of electronic devices including the oxide semiconductor elements described in the above embodiments will be described with reference to FIGS. 11A to 11C.

Figure 11A:
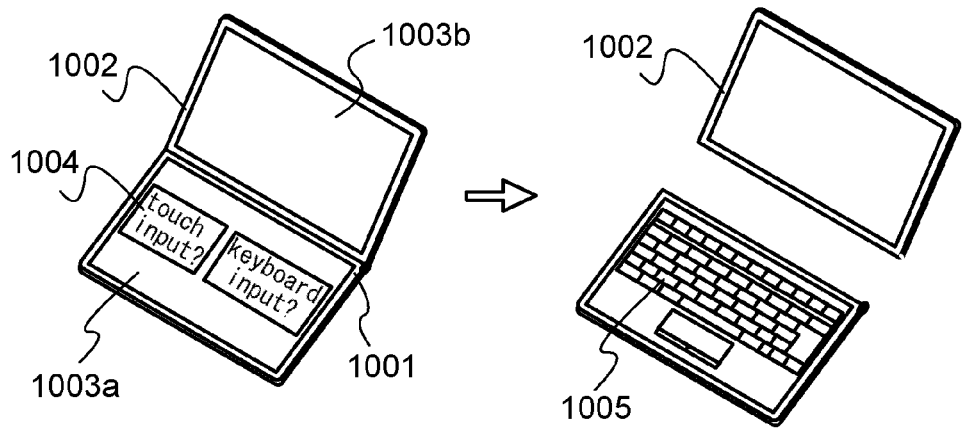
FIGS. 11A to 11C are examples of semiconductor devices described in Embodiment 6.

FIG. 11A illustrates a portable information terminal, which includes a housing 1001, a housing 1002, a first display portion 1003a, a second display portion 1003b, and the like. The first display portion 1003a and the second display portion 1003b each function as a panel having a touch-input function, and an input method can be selected using selection buttons 1004 displayed on the first display portion 1003a, as illustrated in a left part of FIG. 11A, for example. Since the selection buttons with a variety of sizes can be displayed, the portable information terminal can be easily used by people of any generation. In the case where "keyboard input" is selected, for example, a keyboard 1005 is displayed on the first display portion 1003a as illustrated in a right part of FIG. 11A. With the keyboard 1005, letters can be input quickly by keyboard input as in the case of using a conventional information terminal, for example.

In the portable information terminal illustrated in FIG. 11A, the housing 1001 provided with the first display portion 1003a and the housing 1002 provided with the second display portion 1003b can be separated as in the right part of FIG. 11A. Thus, the portable information terminal can be used as a lighter portable information terminal by detaching one of the housing 1001 and the housing 1002 as necessary.

The portable information terminal illustrated in FIG. 11A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Further, an external connection terminal (an earphone terminal, a USB terminal, or the like), a recording medium insertion portion, and the like may be provided on the back surface or the side surface of the housing.

The portable information terminal illustrated in FIG. 11A may transmit and receive data wirelessly. Through wireless communication, desired book data or the like can be purchased and downloaded from an electronic book server.

Further, the housing 1002 illustrated in FIG. 11A may be equipped with an antenna, a microphone function, or a wireless communication function to be used as a mobile phone.

Figure 11B:
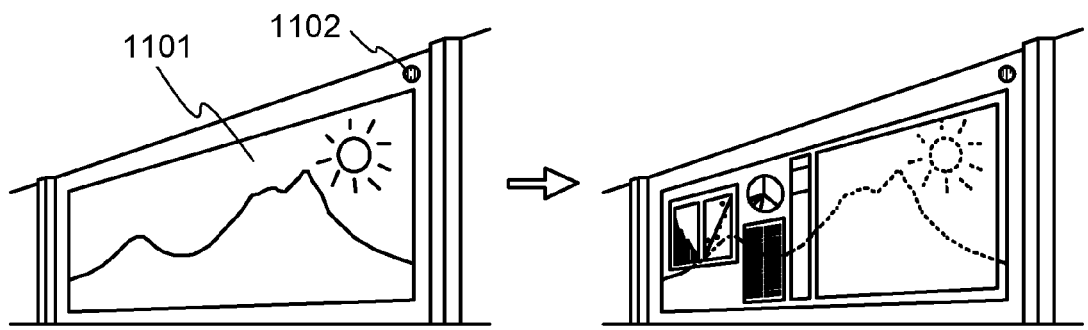

FIG. 11B illustrates one mode of an image display device. The image display device illustrated in FIG. 11B includes a display portion 1101 having a touch-input function, which functions as a window glass. The image display device including the oxide semiconductor element disclosed in this specification can have a sufficient visible light transmittance (e.g., a visible light transmittance of 50% or higher) so that a view in the outside can be seen through the image display device. Thus, for example, although the display portion 1101 functions as a window glass in a normal state as in a left part of FIG. 11B, necessary data can be displayed on the display portion 1101 as illustrated in a right part of FIG. 11B by touching a surface of the display portion 1101.

Further, the display portion 1101 may have a mechanism which transmit and receive data wirelessly. For example, a sound with stable volume can be evenly emitted in the following manner: a piezoelectric oscillator 1102 is provided for the display portion 1101; a sound signal is transmitted to the piezoelectric oscillator 1102 from a wireless mechanism provided for the display portion 1101; the sound signal is received by a wireless mechanism provided in the piezoelectric oscillator 1102; and the display portion 1101 is oscillated.

Figure 11C:
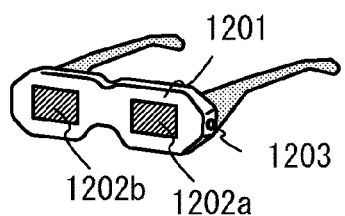
Figure 11C:
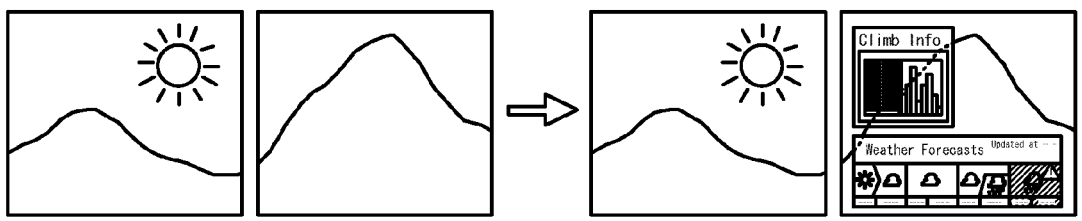

FIG. 11C illustrates one mode of a goggle-type display (head mounted display). The goggle-type display illustrated in FIG. 11C includes a main body portion 1201 provided with a panel 1202a for a left eye, a panel 1202b for a right eye, and an image display button 1203. The panel 1202a for a left eye and the panel 1202b for a right eye including the oxide semiconductor elements disclosed in this specification have a sufficient visible light transmittance (e.g., a visible light transmittance of 50% or higher) so that a view in the outside can be seen through the panels. Thus, in a normal state, a user can see a surrounding view similarly to general glasses as illustrated in a lower left part of FIG. 11C. When a user needs data, the image display button 1203 is pressed in order that data is displayed on one or both of the panel 1202a for a left eye and the panel 1202b for a right eye, as illustrated in a lower right part of FIG. 11C.

The structures, methods, and the like described in this embodiment can be combined as appropriate with any of the structures, methods, and the like described in the other embodiments.

This application is based on Japanese Patent Application serial no. 2011-009745 filed with Japan Patent Office on Jan. 20, 2011, the entire contents of which are hereby incorporated by reference.

What is claimed is:

1. A semiconductor device comprising:
 a gate electrode on an insulating surface;
 a gate insulating layer over the gate electrode; and
 an oxide semiconductor layer over the gate insulating layer,
 wherein the gate electrode and the oxide semiconductor layer overlap with each other with the gate insulating layer between the gate electrode and the oxide semiconductor layer,
 wherein the oxide semiconductor layer has a stacked-layer structure comprising a first oxide semiconductor film and a second oxide semiconductor film,
 wherein the second oxide semiconductor film is between the gate insulating layer and the first oxide semiconductor film, wherein a value of a band gap of the first oxide semiconductor film is smaller than a value of a band gap of the second oxide semiconductor film, and wherein the value of a band gap of the second oxide semiconductor film is larger by 0.2 eV or more than the value of a band gap of the first oxide semiconductor film.

2. The semiconductor device according to claim 1,
wherein the first oxide semiconductor film is crystallized in the thickness direction 3 nm or more from an interface between the first oxide semiconductor film and the second oxide semiconductor film, and wherein the second oxide semiconductor film is crystallized in the thickness direction 3 nm or more from the interface.

3. The semiconductor device according to claim 1, wherein the first oxide semiconductor film contains at least nitrogen or phosphorus.

4. The semiconductor device according to claim 1, wherein the second oxide semiconductor film contains at least boron or aluminum.

5. The semiconductor device according to claim 1, wherein a conduction band level of the first oxide semiconductor film is lower than a conduction band level of the second oxide semiconductor film.

6. An electronic device comprising the semiconductor device according to claim 1.

7. A semiconductor device comprising:
a gate electrode on an insulating surface;
a gate insulating layer over the gate electrode; and
an oxide semiconductor layer over the gate insulating layer,
wherein the gate electrode and the oxide semiconductor layer overlap with each other with the gate insulating layer between the gate electrode and the oxide semiconductor layer,
wherein the oxide semiconductor layer has a stacked-layer structure comprising a first oxide semiconductor film and a second oxide semiconductor film,
wherein the second oxide semiconductor film is between the gate insulating layer and the first oxide semiconductor film, and
wherein a value of a band gap of the first oxide semiconductor film is smaller than a value of a band gap of the second oxide semiconductor film,
wherein a conduction band level of the first oxide semiconductor film is lower than a conduction band level of the second oxide semiconductor film.

8. The semiconductor device according to claim 7, wherein the oxide semiconductor layer comprises Ga.

9. The semiconductor device according to claim 7, wherein the first oxide semiconductor film contains at least nitrogen or phosphorus.

10. The semiconductor device according to claim 7, wherein the second oxide semiconductor film contains at least boron or aluminum.

11. The semiconductor device according to claim 7, wherein the oxide semiconductor layer comprises In and Zn.

12. An electronic device comprising the semiconductor device according to claim 7.

13. A semiconductor device comprising:
a gate electrode on an insulating surface;
a gate insulating layer over the gate electrode; and
an oxide semiconductor layer over the gate insulating layer,
wherein the gate electrode and the oxide semiconductor layer overlap with each other with the gate insulating layer between the gate electrode and the oxide semiconductor layer,
wherein the oxide semiconductor layer has a stacked-layer structure comprising a first oxide semiconductor film and a second oxide semiconductor film,
wherein the second oxide semiconductor film is between the gate insulating layer and the first oxide semiconductor film, and
wherein a value of a band gap of the first oxide semiconductor film is smaller than a value of a band gap of the second oxide semiconductor film,
wherein each of the first oxide semiconductor film and the second oxide semiconductor film comprises In, Ga, and Zn, and
wherein a ratio of In:Ga:Zn of the first oxide semiconductor film is different from a ratio of In:Ga:Zn of the second oxide semiconductor film.

14. An electronic device comprising the semiconductor device according to claim 13.

15. The semiconductor device according to claim 13, wherein the first oxide semiconductor film contains at least nitrogen or phosphorus.

16. The semiconductor device according to claim 13, wherein the second oxide semiconductor film contains at least boron or aluminum.

* * * * *